United States Patent
Ryu et al.

(10) Patent No.: US 12,089,453 B2
(45) Date of Patent: Sep. 10, 2024

(54) DISPLAY APPARATUS COMPRISING OVERLAPPED PIXEL DRIVING CIRCUITS

(71) Applicant: LG DISPLAY CO., LTD., Seoul (KR)

(72) Inventors: WonSang Ryu, Paju-si (KR); SungSoo Shin, Paju-si (KR); Youngjin Yi, Paju-si (KR); Yubeen Lim, Paju-si (KR); SangGul Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 446 days.

(21) Appl. No.: 17/560,642

(22) Filed: Dec. 23, 2021

(65) Prior Publication Data
US 2022/0208926 A1    Jun. 30, 2022

(30) Foreign Application Priority Data
Dec. 31, 2020   (KR) .......................... 10-2020-0188938

(51) Int. Cl.
*H10K 59/126* (2023.01)
*G09G 3/3258* (2016.01)
*H10K 59/122* (2023.01)

(52) U.S. Cl.
CPC ......... *H10K 59/126* (2023.02); *H10K 59/122* (2023.02); *G09G 3/3258* (2013.01); *G09G 2330/04* (2013.01)

(58) Field of Classification Search
CPC .. H10K 59/126; H10K 59/122; H10K 59/131; H10K 59/351; H10K 59/121; H10K 59/1213; H10K 59/1216; H10K 59/123; H10K 59/1315; H10K 50/818; H10K 50/828; G09G 3/3258; G09G 2330/04; G09G 3/3233; G09G 2300/0426;
(Continued)

(56) References Cited

U.S. PATENT DOCUMENTS

2006/0170712 A1   8/2006   Miller et al.
2019/0319080 A1   10/2019  Ke et al.
(Continued)

FOREIGN PATENT DOCUMENTS

CN   106206430 A   12/2016
CN   107154407 A   9/2017
(Continued)

OTHER PUBLICATIONS

Combined Search and Examination Report from the United Kingdom dated Jun. 6, 2022 issued in Patent Application No. GB2118359.5 (6 pages).
(Continued)

*Primary Examiner* — Mohammad A Rahman
(74) *Attorney, Agent, or Firm* — POLSINELLI PC

(57) ABSTRACT

A display apparatus includes a first pixel driving circuit, an electric field blocking layer on the first pixel driving circuit, a second pixel driving circuit on the electric field blocking layer, and a first display element and a second display element on the second pixel driving circuit, wherein each of the first pixel driving circuit and the second pixel driving circuit includes at least one thin film transistor, the first pixel driving circuit overlaps with the second pixel driving circuit, the first display element is connected with the first pixel driving circuit, and the second display element is connected with the second pixel driving circuit.

31 Claims, 13 Drawing Sheets

(58) Field of Classification Search
CPC ... G09G 2300/0452; G09G 2320/0209; G09G 3/3225; G09G 3/3208; G09G 2300/0465
See application file for complete search history.

(56) References Cited

U.S. PATENT DOCUMENTS

| | | | |
|---|---|---|---|
| 2020/0111855 A1 | 4/2020 | Bae et al. | |
| 2020/0212131 A1 | 7/2020 | Kim et al. | |
| 2021/0296419 A1* | 9/2021 | Xu | H10K 59/131 |

FOREIGN PATENT DOCUMENTS

| | | |
|---|---|---|
| JP | 2007-096279 A | 4/2007 |
| JP | 2016-225585 A | 12/2016 |
| JP | 2020-140707 A | 9/2020 |
| JP | 2020-141151 A | 9/2020 |
| KR | 10-0728129 B1 | 6/2007 |
| KR | 2018-0061720 A | 6/2018 |
| KR | 20200039867 A | 4/2020 |
| KR | 2020-0079899 A | 7/2020 |
| WO | 2008072704 A1 | 6/2008 |
| WO | 2011/142089 A1 | 11/2011 |

OTHER PUBLICATIONS

Japanese Office Action dated Nov. 21, 2023 issued in Patent Application No. 2023-044867 (8 pages).
Japanese Office Action dated Nov. 4, 2022 issued in Patent Application No. 2021-213647 (6 pages).

* cited by examiner

DISPLAY APPARATUS COMPRISING OVERLAPPED PIXEL DRIVING CIRCUITS

CROSS-REFERENCE TO RELATED APPLICATION

This application claims the priority of the Korean Patent Application No. 10-2020-0188938 filed on Dec. 31, 2020, which is hereby incorporated by reference in its entirety.

BACKGROUND

Field of the Disclosure

The present disclosure relates to a display apparatus comprising overlapped pixel driving circuits.

Description of the Background

A display apparatus for embodying various kinds of information on a screen is a device in which a core technology of an information communication age is integrated. Recently, the display apparatus has been manufactured to be thinner and more lightweight, and has been developed to embody high performance.

A thin film transistor is used as a switching element or a driving element for driving a pixel constituting the display apparatus. As the display apparatus has high quality and high resolution, the thin film transistor is highly integrated in the display apparatus. As a result, a large number of thin film transistors are disposed in a limited area, whereby problems occur in that the thin film transistor is congested and a capacitor area is not sufficiently obtained.

Therefore, studies for a method of resolving congestion of the thin film transistors in a display apparatus and disposing a large number of thin film transistors in a limited area will be required.

SUMMARY

The present disclosure has been made in view of the above problems and to provide a display apparatus in which thin film transistors are integrated with high density.

The present disclosure is also to provide a display apparatus of high resolution.

The present disclosure is yet to provide a display apparatus in which a plurality of pixel driving circuits are disposed to overlap with one another to dispose a large number of thin film transistors in a limited area.

The present disclosure is still to provide a display apparatus having excellent display performance due to no electrical interference between the thin film transistors even though the thin film transistors are disposed to overlap each other.

Further, the present disclosure is to provide a display apparatus comprising a pixel capable of being stably driven in spite of a small area.

The present disclosure as mentioned above, additional features of the present disclosure will be clearly understood by those skilled in the art from the following description of the present disclosure.

In accordance with an aspect of the present disclosure, a display apparatus comprising a first pixel driving circuit, an electric field blocking layer on the first pixel driving circuit, a second pixel driving circuit on the electric field blocking layer, and a first display element and a second display element on the second pixel driving circuit, wherein each of the first pixel driving circuit and the second pixel driving circuit includes at least one thin film transistor, the first pixel driving circuit overlaps the second pixel driving circuit, the first display element is connected with the first pixel driving circuit, and the second display element is connected with the second pixel driving circuit.

The first display element may overlap with the first pixel driving circuit and the second pixel driving circuit, and the second display element may overlap the first pixel driving circuit and the second pixel driving circuit.

The electric field blocking layer may have a thickness of 1 μm or more between the first pixel driving circuit and the second pixel driving circuit. The thickness of the electric field blocking layer may be defined as a distance between an upper surface of the first pixel driving circuit and a lower surface of the second pixel driving circuit.

The electric field blocking layer may have a dielectric constant of 3.9 or less.

The electric field blocking layer may include a siloxane compound.

Each of the first pixel driving circuit and the second pixel driving circuit may include two or more thin film transistors.

Each of the first pixel driving circuit and the second pixel driving circuit may include four or more thin film transistors.

Any one thin film transistor of the first pixel driving circuit and any one thin film transistor of the second pixel driving circuit may overlap each other, and each of the thin film transistor of the first pixel driving circuit and the thin film transistor of the second pixel driving circuit, which overlap each other, may include an active layer, and a gate electrode spaced apart from the active layer and at least partially overlapped with the active layer, and a spaced distance between the gate electrode of the thin film transistor of the first pixel driving circuit and the active layer of the thin film transistor of the second pixel driving circuit may be 1 μm or more.

The first display element may include a first electrode, a first organic light emitting layer and a second electrode, and the second display element may include a first electrode, a second organic light emitting layer and a second electrode.

Each of the first electrode of the first display element and the first electrode of the second display element may have a reflective layer.

The display apparatus may be a top emission type display apparatus in which each of the first display element and the second display element emits light through the second electrode.

The display apparatus may further comprise a bank layer defining a light emission area of the first display element and a light emission area of the second display element, a first connection portion for connecting the first display element with the first pixel driving circuit, and a second connection portion for connecting the second display element with the second pixel driving circuit, wherein at least one of the first connection portion and the second connection portion may overlap the bank layer.

At least a portion of the first connection portion may overlap the bank layer.

The first connection portion may include a first portion passing through the electric field blocking layer, and the first portion may overlap the bank layer.

Each of the thin film transistor of the first pixel driving circuit and the thin film transistor of the second pixel driving circuit may include an active layer and a gate electrode spaced apart from the active layer, and a thickness 't' of the electric field blocking layer satisfies the following Equation 1:

$$t \geq (V_{GH}/V_{TH}) \times (\kappa/3.9) \times (t_{GI}), \quad \text{[Equation 1]}$$

in Equation 1, t is the thickness of the electric field blocking layer, κ is a dielectric constant of the electric field blocking layer, $V_{GH}$ is a turn-on voltage applied to the thin film transistor of the first pixel driving circuit, $V_{TH}$ is a threshold voltage of the thin film transistor of the second pixel driving circuit, and $t_{GI}$ is a distance between the gate electrode and the active layer of the thin film transistor of the second pixel driving circuit.

In accordance with another aspect of the present disclosure, a display apparatus comprising a first pixel including a first pixel driving circuit and a first display element connected with the first pixel driving circuit, a second pixel including a second pixel driving circuit and a second display element connected with the second pixel driving circuit, a third pixel including a third pixel driving circuit and a third display element connected with the third pixel driving circuit, a fourth pixel including a fourth pixel driving circuit and a fourth display element connected with the fourth pixel driving circuit, and an electric field blocking layer disposed between the first pixel driving circuit and the second pixel driving circuit and between the third pixel driving circuit and the fourth pixel driving circuit, wherein the first pixel driving circuit and the second pixel driving circuit overlap each other, the third pixel driving circuit and the fourth pixel driving circuit overlap each other, the first pixel and the second pixel constitute a first display unit, the third pixel and the fourth pixel constitute a second display unit, and the first display unit and the second display unit are adjacent to each other.

The electric field blocking layer may have a thickness of 1 μm or more. In this case, the thickness of the electric field blocking layer may be defined as a distance between an upper surface of the first pixel driving circuit and a lower surface of the second pixel driving circuit.

The electric field blocking layer may have a dielectric constant of 3.9 or less.

The electric field blocking layer may include a siloxane compound.

Each of the first pixel driving circuit and the second pixel driving circuit may include at least one thin film transistor, each of the thin film transistor of the first pixel driving circuit and the thin film transistor of the second pixel driving circuit may include an active layer and a gate electrode spaced apart from the active layer, and the thickness 't' of the electric field blocking layer may satisfy the following Equation 1:

$$t \geq (V_{GH}/V_{TH}) \times (\kappa/3.9) \times (t_{GI}), \quad \text{[Equation 1]}$$

in Equation 1, t is the thickness of the electric field blocking layer, κ is a dielectric constant of the electric field blocking layer, $V_{GH}$ is a turn-on voltage applied to the thin film transistor of the first pixel driving circuit, $V_{TH}$ is a threshold voltage of the thin film transistor of the second pixel driving circuit, and $t_{GI}$ is a distance between the gate electrode and the active layer of the thin film transistor of the second pixel driving circuit.

Each of the first pixel driving circuit, the second pixel driving circuit, the third pixel driving circuit and the fourth pixel driving circuit may include two or more thin film transistors.

The display apparatus may be a top emission type display apparatus.

Each of the first pixel driving circuit, the second pixel driving circuit, the third pixel driving circuit and the fourth pixel driving circuit may include four or more thin film transistors.

The first pixel may display a first color, the second pixel may display a second color, the third pixel may display a third color, the fourth pixel may display a fourth color, the first color, the second color, the third color and the fourth color may be the colors different from one another, and any one of the first color, the second color, the third color and the fourth color may be white.

Another one of the first color, the second color, the third color and the fourth color may be red, still another one may be green, and further still another one may be blue.

The first pixel may display a first color, the second pixel may display a second color, the third pixel may display the first color, the fourth pixel may display a third color, and the first color, the second color and the third color may be the colors different from one another.

The first color may be green, any one of the second color and the third color may be red and the other one may be blue.

The display apparatus may further comprise light transmitting portions adjacent to the first display unit and the second display unit, wherein the light transmitting portions may transmit light.

The display apparatus may further comprise a fifth pixel including a fifth pixel driving circuit and a fifth display element connected with the fifth pixel driving circuit, and a sixth pixel including a sixth pixel driving circuit and a sixth display element connected with the sixth pixel driving circuit, the fifth pixel driving circuit and the sixth pixel driving circuit may overlap each other, the electric field blocking layer may be disposed between the fifth pixel driving circuit and the sixth pixel driving circuit, the fifth pixel and the sixth pixel may constitute a third display unit, and the third display unit may be adjacent to at least one of the first display unit and the second display unit.

The first pixel may display a first color, the second pixel may display a second color, the third pixel may display a third color, the fourth pixel may display the first color, the fifth pixel may display the second color, the sixth pixel may display the third color, and the first color, the second color and the third color may be the colors different from one another.

The first color may be red, the second color may be green, and the third color may be blue.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
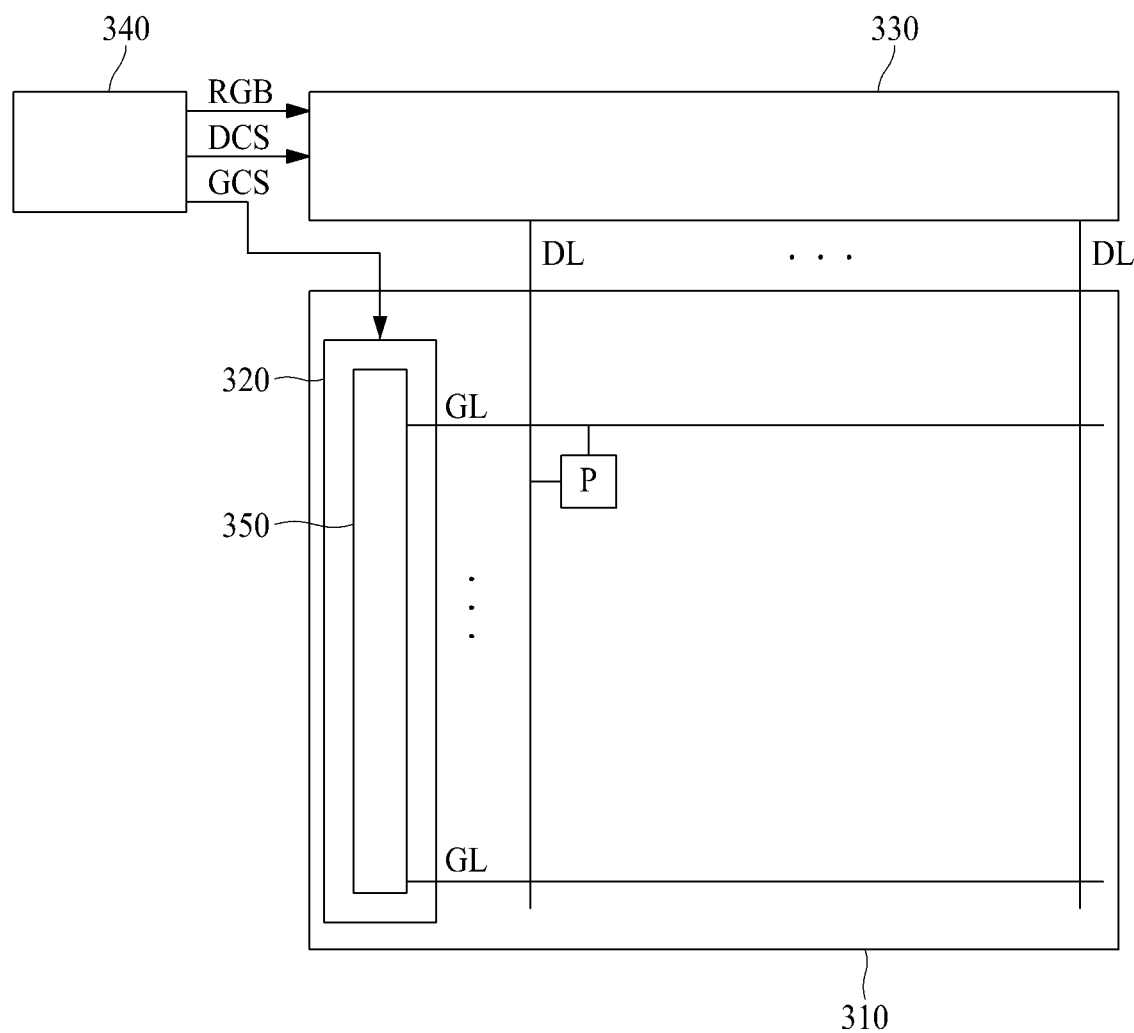
FIG. 1 is a schematic view illustrating a display apparatus according to one aspect of the present disclosure.

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

Spatially relative terms such as "below", "beneath", "lower", "above" and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below" or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element and, similarly, a second element could be termed a first element, without departing from the scope of the present disclosure.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

In the drawings, the same or similar elements are denoted by the same reference numerals even though they are depicted in different drawings. Wherever possible, the same reference numbers will be used throughout the drawings to refer to the same or like parts.

In the aspects of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In some aspects of the present disclosure, for convenience of description, a source area is distinguished from a source electrode and a drain area is distinguished from a drain electrode. However, the aspects of the present disclosure are not limited to this structure. For example, the source area may be the source electrode, and the drain area may be the drain electrode. Also, the source area may be the drain electrode, and the drain area may be the source electrode.

FIG. 1 is a schematic view illustrating a display apparatus 100 according to one aspect of the present disclosure.

As shown in FIG. 1, the display apparatus 100 includes a display panel 310, a gate driver 320, a data driver 330, and a controller 340.

Gate lines GL and data lines DL are disposed in the display panel 310, and pixels P are disposed in intersection areas of the gate lines GL and the data lines DL. An image is displayed by driving of the pixels P The controller 340 controls the gate driver 320 and the data driver 330.

The controller 340 outputs a gate control signal GCS for controlling the gate driver 320 and a data control signal DCS for controlling the data driver 330 by using a signal that is supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 to an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage that may turn on a switching element (thin film transistor) disposed in the pixel P.

Also, the shift register 350 supplies a gate-off signal capable of turning off a switching element, to the gate line GL for the other period of one frame, in which the gate pulse is not supplied. Hereinafter, the gate pulse and the gate-off signal will collectively be referred to as a scan signal SS or Scan.

According to one aspect of the present disclosure, the gate driver 320 may be packaged on the display panel 310. In this way, a structure in which the gate driver 320 is directly packaged on the display panel 310 will be referred to as a Gate In Panel (GIP) structure.

Figure 2:
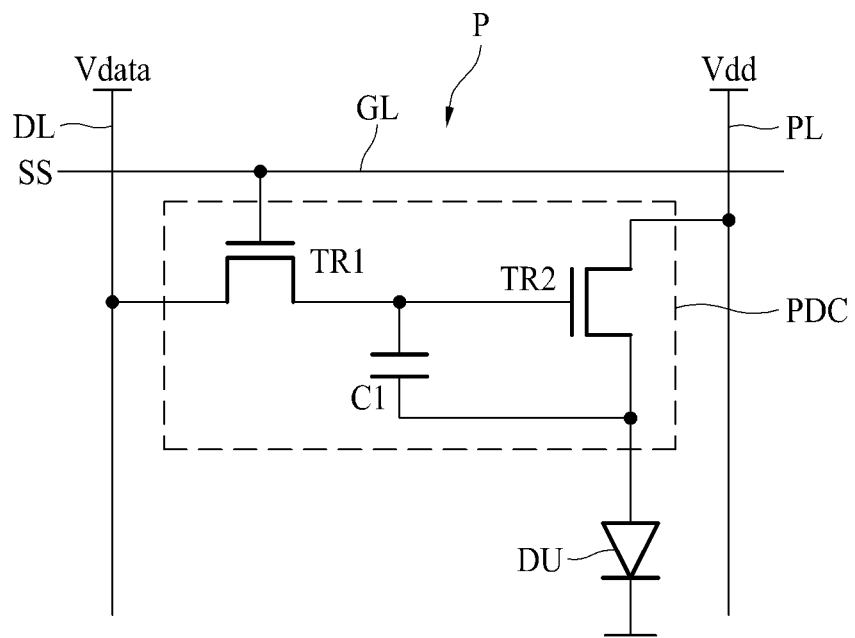
FIG. 2 is a circuit view illustrating any one pixel of FIG. 1.

FIG. 2 is a circuit view illustrating any one pixel of FIG. 1.

The circuit view of FIG. 2 is an equivalent circuit view for a pixel P of a display apparatus that includes an organic light emitting diode (OLED) as a display element DU. The display apparatus 100 according to one aspect of the present disclosure is an organic light emitting display apparatus that includes an organic light emitting diode (OLED).

The pixel P includes a display element DU, and a pixel driving circuit PDC for driving the display element DU.

The pixel driving circuit PDC of FIG. 2 includes a first thin film transistor TR1 that is a switching transistor, and a second thin film transistor TR2 that is a driving transistor.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element DU, and the second thin film transistor TR2 controls the driving voltage Vdd. The driving voltage Vdd is a pixel driving voltage for driving the organic light emitting diode (OLED) that is the display element DU.

When the first thin film transistor TR1 is turned on by the scan signal SS applied from the gate driver 320 through the gate line GL, the data voltage Vdata supplied through the data line DL is supplied to a gate electrode of the second thin film transistor TR2 connected with the display element DU. The data voltage Vdata is charged in a first capacitor C1 formed between the gate electrode and a source electrode of the second thin film transistor TR2. The first capacitor C1 is a storage capacitor Cst.

The amount of a current supplied to the organic light emitting diode (OLED), which is the display element DU, through the second thin film transistor TR2 is controlled in accordance with the data voltage Vdata, whereby gray scale of light emitted from the display element DU may be controlled.

Figure 3:
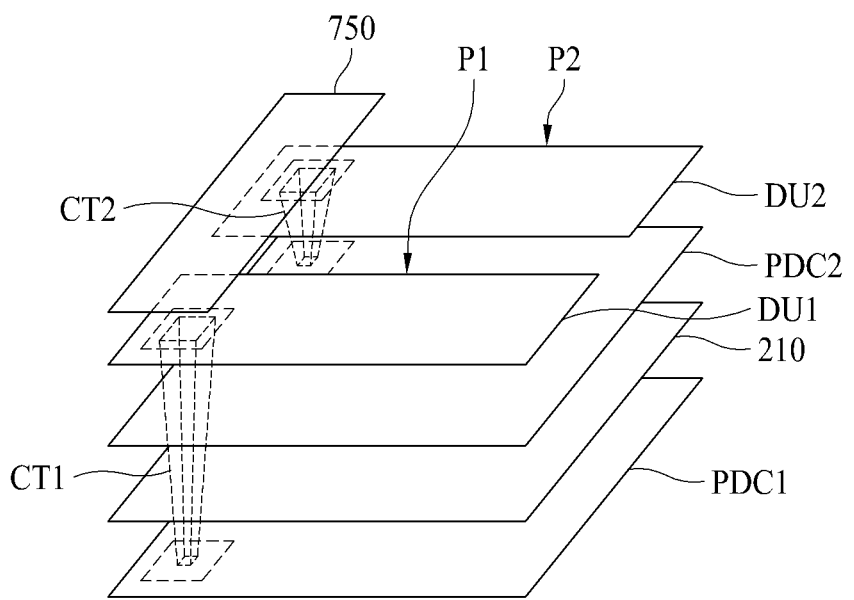
FIG. 3 is a schematic view illustrating an array of pixels of a display apparatus according to one aspect of the present disclosure.

FIG. 3 is a schematic view illustrating an array of pixels P1 and P2 of a display apparatus according to one aspect of the present disclosure.

Referring to FIG. 3, the display apparatus 100 according to one aspect of the present disclosure includes a first pixel driving circuit PDC1, an electric field blocking layer 210 on the first pixel driving circuit PDC1, a second pixel driving circuit PDC2 on the electric field blocking layer 210, and a first display element DU1 and a second display element DU2 on the second pixel driving circuit PDC2.

Each of the first pixel driving circuit PDC1 and the second pixel driving circuit PDC2 may include at least one thin film transistor.

According to one aspect of the present disclosure, the first display element DU1 is connected with the first pixel driving circuit PDC1. Referring to FIG. 3, the first display element DU1 and the first pixel driving circuit PDC1 may be connected with each other by a first connection portion CT1.

A first pixel P1 may be formed by the first display element DU1 and the first pixel driving circuit PDC1. The first pixel P1 may further include a color filter. The first pixel P1 may have the same structure as that of the pixel P shown in FIG. 2. The first pixel P1 may be represented by the circuit view of FIG. 2.

The first pixel driving circuit PDC1 may have the same structure as that of the pixel driving circuit PDC shown in FIG. 2. The first pixel driving circuit PDC1 may be represented by the same circuit view as that of the pixel driving circuit PDC shown in FIG. 2. The first display element DU1 may be, for example, an organic light emitting diode (OLED). The first display element DU1 may include an organic light emitting layer.

According to one aspect of the present disclosure, the second display element DU2 is connected with the second pixel driving circuit PDC2. Referring to FIG. 3, the second display element DU2 and the second pixel driving circuit PDC2 may be connected with each other by a second connection portion CT2.

A second pixel P2 may be formed by the second display element DU2 and the second pixel driving circuit PDC2. The second pixel P2 may further include a color filter. The second pixel P2 may have the same structure as that of the pixel P shown in FIG. 2. The second pixel P2 may be represented by the circuit view of FIG. 2.

The second pixel driving circuit PDC2 may have the same structure as that of the pixel driving circuit PDC shown in FIG. 2. The second pixel driving circuit PDC2 may be represented by the same circuit view as that of the pixel driving circuit PDC shown in FIG. 2. The second display element DU2 may be, for example, an organic light emitting diode (OLED). The second display element DU2 may include an organic light emitting layer.

According to one aspect of the present disclosure, the first pixel driving circuit PDC1 is overlapped with the second pixel driving circuit PDC2. Referring to FIG. 3, the first pixel driving circuit PDC1 and the second pixel driving circuit PDC2 are disposed in their respective layers different from each other and overlap each other along a thickness direction. Since the first pixel driving circuit PDC1 and the second pixel driving circuit PDC2 are disposed to overlap each other, the first pixel driving circuit PDC1 and the second pixel driving circuit PDC2 may be disposed in areas occupied by the two pixels P1 and P2, respectively, based on a plane. As a result, the area occupied by each of the first pixel driving circuit PDC1 and the second pixel driving circuit PDC2 may be widened.

In general, an area of the pixel P is recognized as an area of the display element DU. Therefore, according to one aspect of the present disclosure, an area of the first display element DU1 may be referred to as an area of the first pixel P1, and an area of the second display element DU2 may be referred to as an area of the second pixel P2. According to one aspect of the present disclosure, since the first pixel driving circuit PDC1 and the second pixel driving circuit PDC2 may be disposed in an area in which the area of the first pixel P1 and the area of the second pixel P2 are combined, the area of each of the first pixel driving circuit PDC1 and the second pixel driving circuit PDC2 may be widened.

According to one aspect of the present disclosure, when the area of each of the first pixel driving circuit PDC1 and the second pixel driving circuit PDC2 is widened, the first pixel driving circuit PDC1 and the second pixel driving circuit PDC2 may easily be designed and a space for arranging electrodes, lines, contact holes, capacitors, etc. included in the first and second pixel driving circuits PDC1 and PDC2 may be widened. In particular, an area of the first capacitor C1 of the first pixel driving circuit PDC1 and the second pixel driving circuit PDC2 may be widened.

In addition, even though each of the first pixel P1 and the second pixel P2 has a small sized area in the display apparatus of high resolution, the first pixel driving circuit PDC1 and the second pixel driving circuit PDC2 may have an area capable of being designed.

Unlike the configuration according to one aspect of the present disclosure, when a plurality of thin film transistors are simply deposited up and down, a contact hole for connecting the deposited thin film transistors with another element is additionally required. When the number of contact holes is increased in the pixel driving circuit, an area occupied by the contact hole is increased, and area loss due to the contact hole is generated. As a result, a problem occurs in that an area, which may be occupied by other elements, for example, a capacitor or a channel portion of an active layer, may be reduced.

On the other hand, according to one aspect of the present disclosure, the thin film transistors do not overlap each other in one pixel driving circuit, but the plurality of pixel driving circuits PDC1 and PDC2 overlap each other. As a result, additional contact hole for connecting the deposited thin film transistors with another elements is not required, whereby area loss due to the contact hole may be avoided. Therefore, according to one aspect of the present disclosure, since the pixel driving circuits PDC1 and PDC2 are disposed in a relatively wide area, the area of the capacitor or the channel portion may easily be ensured.

Referring to FIG. 3, the first display element DU1 overlaps the first pixel driving circuit PDC1 and the second pixel driving circuit PDC2, and the second display element DU2 also overlaps the first pixel driving circuit PDC1 and the second pixel driving circuit PDC2. The first pixel P1 and the second pixel P2 may form one pixel unit (display unit).

As shown in FIG. 3, when the first pixel driving circuit PDC1 and the second pixel driving circuit PDC2 are overlapped with each other, thin film transistors included in the first pixel driving circuit PDC1 and the second pixel driving circuit PDC2 may overlap each other. When the thin film transistors are overlapped with each other, the thin film transistors may be affected by each other and their driving may become unstable. According to one aspect of the present disclosure, an electric field blocking layer 210 is disposed between the first pixel driving circuit PDC1 and the second pixel driving circuit PDC2 to prevent the thin film transistor included in the first pixel driving circuit PDC1 and the thin film transistor included in the second pixel driving circuit PDC2 from being affected by each other.

The electric field blocking layer 210 prevents an electric field generated by the thin film transistor included in the first pixel driving circuit PDC1 from affecting the thin film transistor included in the second pixel driving circuit PDC2. In addition, the electric field blocking layer 210 prevents an electric field generated by the thin film transistor included in the second pixel driving circuit PDC2 from affecting the thin film transistor included in the first pixel driving circuit PDC1.

In order to prevent the thin film transistor included in the first pixel driving circuit PDC1 and the thin film transistor included in the second pixel driving circuit PDC2 from being electrically affected by each other, the electric field blocking layer 210 has a low dielectric constant and a great thickness.

According to one aspect of the present disclosure, the electric field blocking layer 210 may have a thickness of 1 μm or more between the first pixel driving circuit PDC1 and the second pixel driving circuit PDC2. In this case, the thickness of the electric field blocking layer 210 is defined as a distance from an upper surface of the first pixel driving circuit PDC1 to a lower surface of the second pixel driving circuit PDC2.

According to one aspect of the present disclosure, the electric field blocking layer 210 may have a thickness of 1 μm or more in the entire area between the first pixel driving circuit PDC1 and the second pixel driving circuit PDC2. In more detail, in the entire area between the first pixel driving circuit PDC1 and the second pixel driving circuit PDC2, the electric field blocking layer 210 may have a thickness of 1.5 μm or more, or may have a thickness of 2.0 μm or more.

As the dielectric constant of the electric field blocking layer 210 is small, electrical mutual interference between the first pixel driving circuit PDC1 and the second pixel driving circuit PDC2 may be reduced. The thickness of the electric field blocking layer 210 may vary depending on the dielectric constant of the electric field blocking layer 210. According to one aspect of the present disclosure, the electric field blocking layer 210 may have a dielectric constant of 3.9 or less. In more detail, the electric field blocking layer 210 may have a dielectric constant of 3.5 or less, may have a dielectric constant of 3.0 or less, or may have a dielectric constant of 2.5 or less.

According to one aspect of the present disclosure, the electric field blocking layer 210 may include a siloxane compound. In more detail, the electric field blocking layer 210 may be made of a siloxane compound. A low electric constant siloxane compound may be used as the siloxane compound.

According to one aspect of the present disclosure, the smaller the dielectric constant of the electric field blocking layer 210 is, the smaller the thickness of the electric field blocking layer 210 is. The greater the dielectric constant of the electric field blocking layer 210 is, the greater the thickness of the electric field blocking layer 210 is. The thickness of the electric field blocking layer 210 may be proportional to the dielectric constant of the electric field blocking layer 210. When the dielectric constant of the electric field blocking layer 210 is κ, the thickness 't' of the electric field blocking layer may satisfy the following relational expression 1.

$$t \propto \kappa \qquad \text{[Relational expression 1]}$$

According to one aspect of the present disclosure, each of the first and second pixel driving circuits PDC1 and PDC2 may include two or more thin film transistors. In addition, according to one aspect of the present disclosure, each of the first and second pixel driving circuits PDC1 and PDC2 may include four or more thin film transistors.

Hereinafter, the display apparatus 100 according to one aspect of the present disclosure will be described in more detail with reference to FIGS. 4 to 7.

Figure 4:
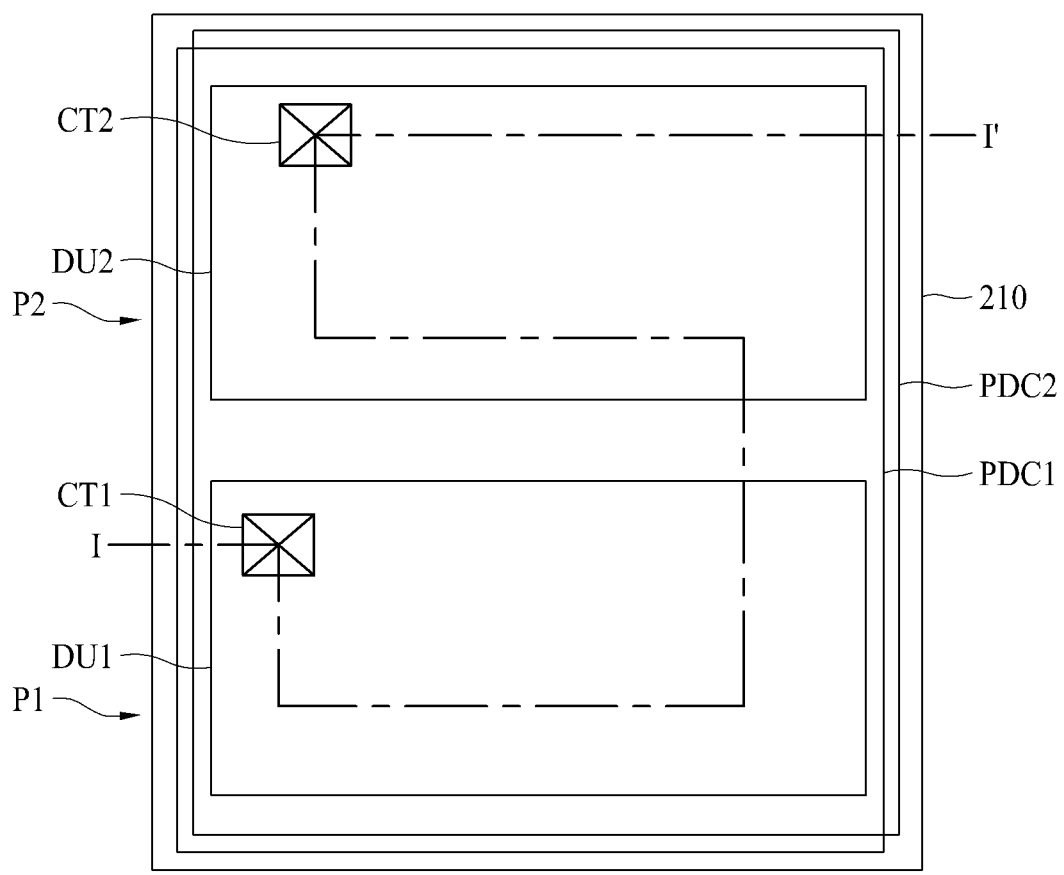
FIG. 4 is a schematic plan view illustrating a first pixel and a second pixel according to one aspect of the present disclosure.
Figure 5:
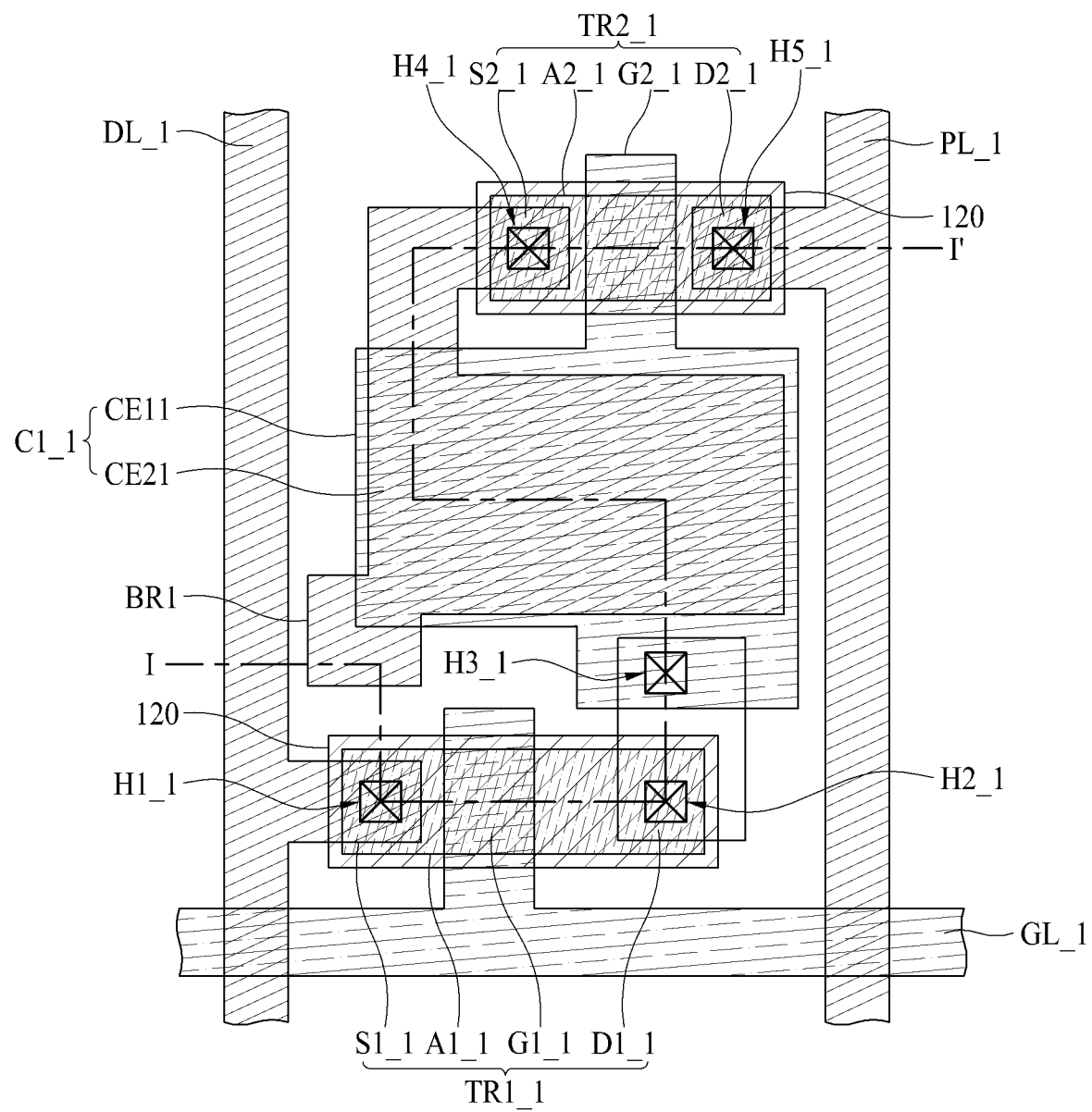
FIG. 5 is a plan view illustrating a first pixel driving circuit.

FIG. 4 is a schematic plan view illustrating a first pixel P1 and a second pixel P2 according to one aspect of the present disclosure. A deposited structure of FIG. 4 may be similar to that of FIG. 3. FIG. 5 is a plan view illustrating a first pixel driving circuit PDC1, and FIG. 6 is a plan view illustrating a second pixel driving circuit PDC2 and display elements DU1 and DU2.

In the display apparatus 100 according to one aspect of the present disclosure, the first pixel P1 and the second pixel P2 may have a planar layer as shown in FIG. 4. The cut lines I-I' of FIGS. 5 and 6 reflect the cut line I-I' of FIG. 4. In FIGS. 4, 5 and 6, the cut lines I-I' are those for the same portion.

FIG. 5 is a plan view of the first pixel driving circuit PDC1. In detail, FIG. 5 may be a plan view of a lower portion of the electric field blocking layer 210 in FIGS. 3 and 4.

Figure 6:
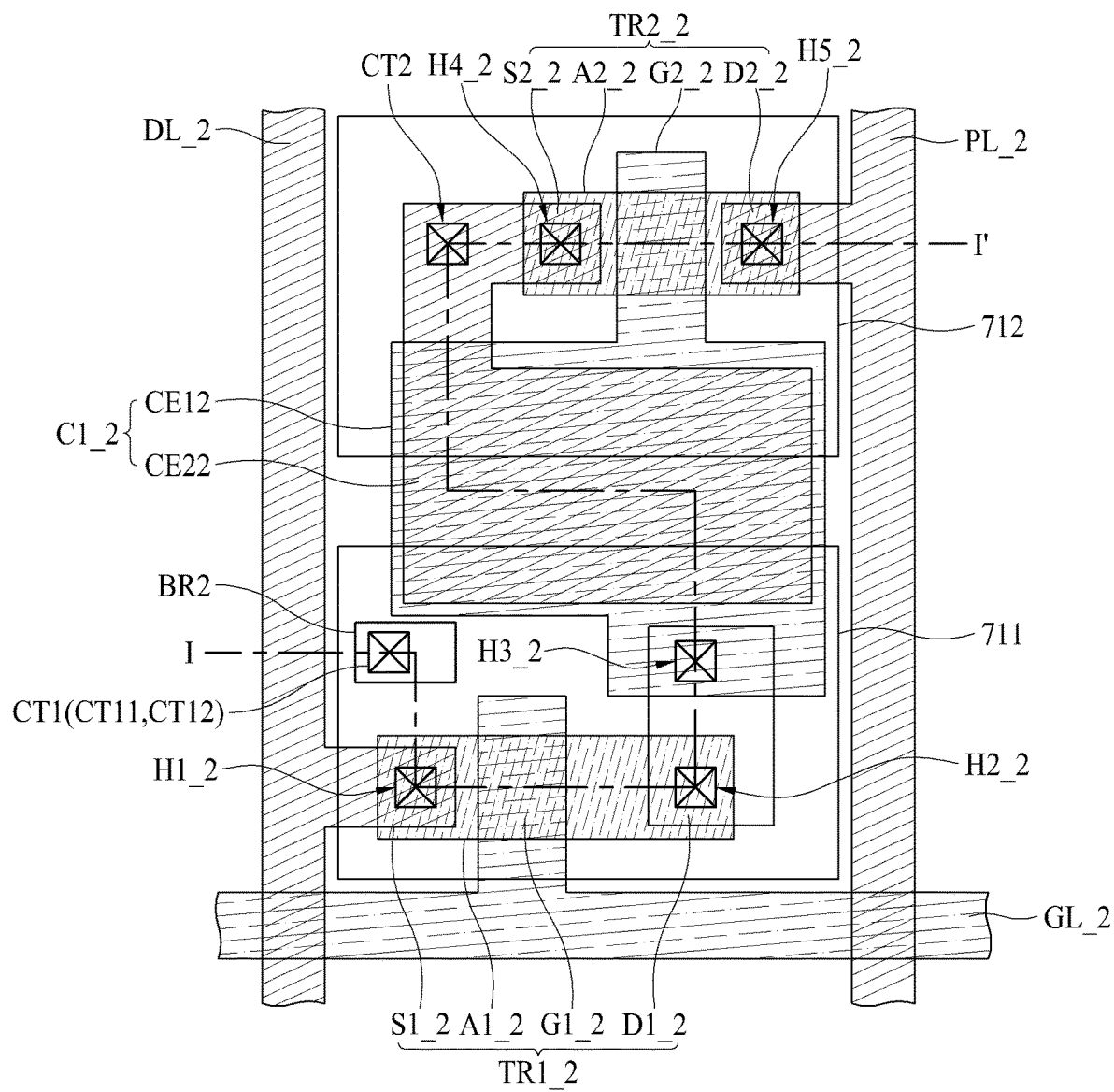
FIG. 6 is a plan view illustrating a second pixel driving circuit and display elements.

FIG. 6 is a plan view of the second pixel driving circuit PDC2 and the display elements DU1 and DU2. In detail, FIG. 6 may be a plan view of an upper portion of the electric field blocking layer 210 in FIGS. 3 and 4.

Figure 7:
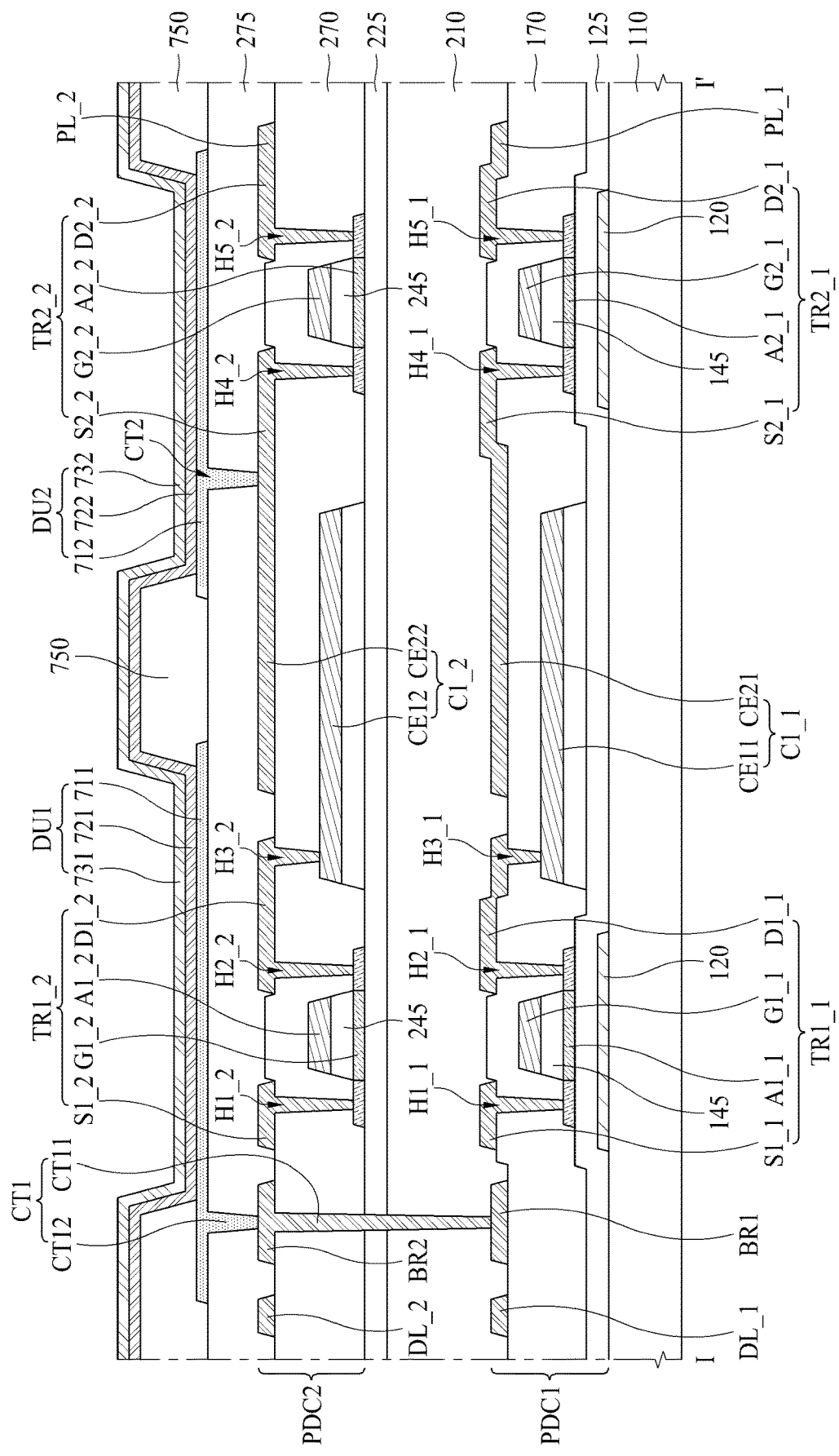
FIG. 7 is a cross-sectional view taken along line I-I' of FIGS. 4, 5 and 6.

FIG. 7 is a cross-sectional view taken along line I-I' of FIGS. 4, 5 and 6, and FIG. 8 is an enlarged view of a portion of FIG. 7.

Referring to FIG. 7, the first thin film transistor TR1 and the second thin film transistor TR2 are disposed on the substrate 110.

The first pixel driving circuit PDC1 includes a first thin film transistor TR1_1 and a second thin film transistor TR2_1. The first thin film transistor TR1_1 of the first pixel driving circuit PDC1 includes an active layer A1_1, a gate electrode G1_1, a source electrode S1_1 and a drain electrode D1_1. The second thin film transistor TR2_1 of the first pixel driving circuit PDC1 includes an active layer A2_1, a gate electrode G2_1, a source electrode S2_1 and a drain electrode D2_1.

The first pixel driving circuit PDC1 may be represented by the same circuit view as the pixel driving circuit PDC shown in FIG. 2. Also, the second pixel driving circuit PDC2 may also be represented by the same circuit view as the pixel driving circuit PDC shown in FIG. 2.

The substrate 110 may be made of glass or plastic. Plastic having a flexible property, for example, polyimide (PI) may be used as the substrate 110.

A light shielding layer 120 is disposed on the substrate 110. The light shielding layer 120 may shield light incident from the outside to protect the active layers A1_1 and A2_1. The light shielding layer 120 may be omitted.

A buffer layer 125 is disposed on the light shielding layer 120 and the substrate 110. The buffer layer 125 is made of an insulating material and protects the active layers A1_1 and A2_1 from external moisture or oxygen.

The active layer A1_1 of the first thin film transistor TR1_1 and the active layer A2_1 of the second thin film transistor TR2_1 are disposed on the buffer layer 125.

Each of the active layers A1_1 and A2_1 may include an oxide semiconductor material. According to one aspect of the present disclosure, the active layers A1_1 and A2_1 may be oxide semiconductor layers made of an oxide semiconductor material.

According to one aspect of the present disclosure, the active layers A1_1 and A2_1 are disposed on the substrate 110. The active layers A1_1 and A2_1 may include at least one of ZO(ZnO)-based, IZO(InZnO)-based, IGZO(InGaZnO)-based, TO(SnO)-based, IGO(InGaO)-based, ITO (InSnO)-based, IGZTO(InGaZnSnO)-based, GZTO (GaZnSnO)-based, GZO(GaZnO)-based, GO(GaO)-based, IO(InO)-based, FIZO(FeInZnO)-based or ITZO(InSnZnO) oxide semiconductor material. The active layers A1_1 and A2_1 may have a single layered structure, or may have a multi-layered structure that includes two or more oxide semiconductor layers.

According to one aspect of the present disclosure, the active layers A1_1 and A2_1 may include a channel portion and a conductorization portion disposed on both sides of the channel portion. According to one aspect of the present disclosure, the active layers A1_1 and A2_1 may selectively be conductorized by selective conductorization using gate electrodes G1_1 and G2_1 as masks. An area of the active layers A1_1 and A2_1, which is overlapped with the gate electrodes G1_1 and G2_1, is not conductorized, and thus may become the channel portion. An area of the active layers A1_1 and A2_1, which is not overlapped with the gate electrodes G1_1 and G2_1, is conductorized, and thus may become the conductorization portion.

According to one aspect of the present disclosure, one of the conductorization portions may be a source area and the other one thereof may be a drain area. The source area serves as a source connection portion connected with the source electrodes S1_1 and S2_1. The drain area serves as a drain connection portion connected with the drain electrodes D1_1 and D2_1.

A gate insulating layer 145 is disposed on the active layers A1_1 and A2_1. The gate insulating layer 145 has insulation properties and spaces the active layers A1_1 and A2_1 apart from the gate electrodes G1_1 and G2_1. A patterned gate insulating layer 145 is shown in FIG. 7, but one aspect of the present disclosure is not limited thereto. The gate insulating layer 145 may not be patterned.

The gate electrode G1_1 of the first thin film transistor TR1_1 and the gate electrode G2_1 of the second thin film transistor TR2_1 are disposed on the gate insulating layer 145.

The gate electrode G1_1 of the first thin film transistor TR1_1 is spaced apart from the active layer A1_1 of the first thin film transistor TR1_1 and overlaps at least a portion of the active layer A1_1 of the first thin film transistor TR1_1. The gate electrode G2_1 of the second thin film transistor TR2_1 is spaced apart from the active layer A2_1 of the second thin film transistor TR2_1 and overlaps at least a portion of the active layer A2_1 of the second thin film transistor TR2_1.

Referring to FIG. 7, a first capacitor electrode CE11 of a first capacitor C1_1 is disposed in the same layer as the gate electrodes G1_1 and G2_1. The gate electrodes G1_1 and G2_1 and the first capacitor electrode CE11 may be made together by the same process using the same material.

An interlayer dielectric layer 170 is disposed on the gate electrodes G1_1 and G2_1 and the first capacitor electrode CE11.

The source electrodes S1_1 and S2_1 and the drain electrodes D1_1 and D2_1 are disposed on the interlayer dielectric layer 170. According to one aspect of the present disclosure, the source electrodes S1_1 and S2_1 and the drain electrodes D1_1 and D2_1 are distinguished for convenience of description, and the source electrodes S1_1 and S2_1 and the drain electrodes D1_1 and D2_1 may be used interchangeably. Therefore, the source electrodes S1_1 and S2_1 may be the drain electrodes D1_1 and D2_1, and the drain electrodes D1_1 and D2_1 may be the source electrodes S1_1 and S2_1.

The data line DL_1 and the driving power line PL_1 are disposed on the interlayer dielectric layer 170. The source electrode S1_1 of the first thin film transistor TR1_1 may integrally be formed with the data line DL_1. The drain electrode D2_1 of the second thin film transistor TR2_1 may integrally be formed with the driving power line PL_1.

According to one aspect of the present disclosure, the source electrode S1_1 and the drain electrode D1_1 of the first thin film transistor TR1_1 are spaced apart from each other and connected with the active layer A1_1 of the first thin film transistor TR1_1. The source electrode S2_1 and the drain electrode D2_1 of the second thin film transistor TR2_1 are spaced apart from each other and are connected with the active layer A2_1 of the second thin film transistor TR2_1.

In detail, the source electrode S1_1 of the first thin film transistor TR1_1 is in contact with a source area of the active layer A1_1 through a first contact hole H1_1.

The drain electrode D1_1 of the first thin film transistor TR1_1 is in contact with a drain area of the active layer A1_1 through a second contact hole H2_1, and is connected with the first capacitor electrode CE11 of the first capacitor C1_1 through a third contact hole H3_1.

The source electrode S2_1 of the second thin film transistor TR2_1 is in contact with a source area of the active layer A2_1 through a fourth contact hole H4_1.

The source electrode S2_1 of the second thin film transistor TR2_1 is extended onto the interlayer dielectric layer 170, and a portion thereof serves as a second capacitor electrode CE21 of the first capacitor C1_1. The first capacitor electrode CE11 and the second capacitor electrode CE21 are overlapped with each other to form the first capacitor C1_1.

Referring to FIGS. 5 and 7, the second capacitor electrode CE21 of the first capacitor C1_1 is extended out of the area of first capacitor C1_1 to form a first bridge BR1.

The drain electrode D2_1 of the second thin film transistor TR2_1 is in contact with a drain area of the active layer A2_1 through a fifth contact hole H5_1.

The first thin film transistor TR1_1 includes an active layer A1_1, a gate electrode G1_1, a source electrode S1_1 and a drain electrode D1_1, and serves as a switching transistor for controlling a data voltage Vdata applied to the first pixel driving circuit PDC1.

The second thin film transistor TR2_1 includes an active layer A2_1, a gate electrode G2_1, a source electrode S2_1 and a drain electrode D2_1, and serves as a driving transistor for controlling a driving voltage Vdd applied to the first display element DU1. Referring to FIG. 5, the second thin film transistor TR2_1 is connected with the first display element DU1 through the first bridge BR1.

The electric field blocking layer 210 is disposed on the source electrodes S1_1 and S2_1, the drain electrodes D1_1 and D2_1, the data line DL_1, the driving power line PL_1 and the first bridge BR1.

The electric field blocking layer 210 serves to prevent the thin film transistors TR1_1 and TR2_1 included in the first pixel driving circuit PDC1 and the thin film transistors TR1_2 and TR2_2 included in the second pixel driving circuit PDC2 from being electrically affected by each other. In order to prevent the thin film transistors TR1_1 and TR2_1 included in the first pixel driving circuit PDC1 and the thin film transistors TR1_2 and TR2_2 included in the second pixel driving circuit PD2 from being electrically affected by each other, the electric field blocking layer 210 has a low dielectric constant and a great thickness.

According to one aspect of the present disclosure, the electric field blocking layer 210 may have a dielectric constant of 3.9 or less. In more detail, the electric field blocking layer 210 may have a dielectric constant of 3.5 or less, may have a dielectric constant of 3.0 or less, or may have a dielectric constant of 2.5 or less.

According to one aspect of the present disclosure, the electric field blocking layer 210 may include a siloxane compound. In more detail, the electric field blocking layer 210 may be made of a siloxane compound. A low dielectric constant siloxane compound may be used as the siloxane compound.

Figure 8:
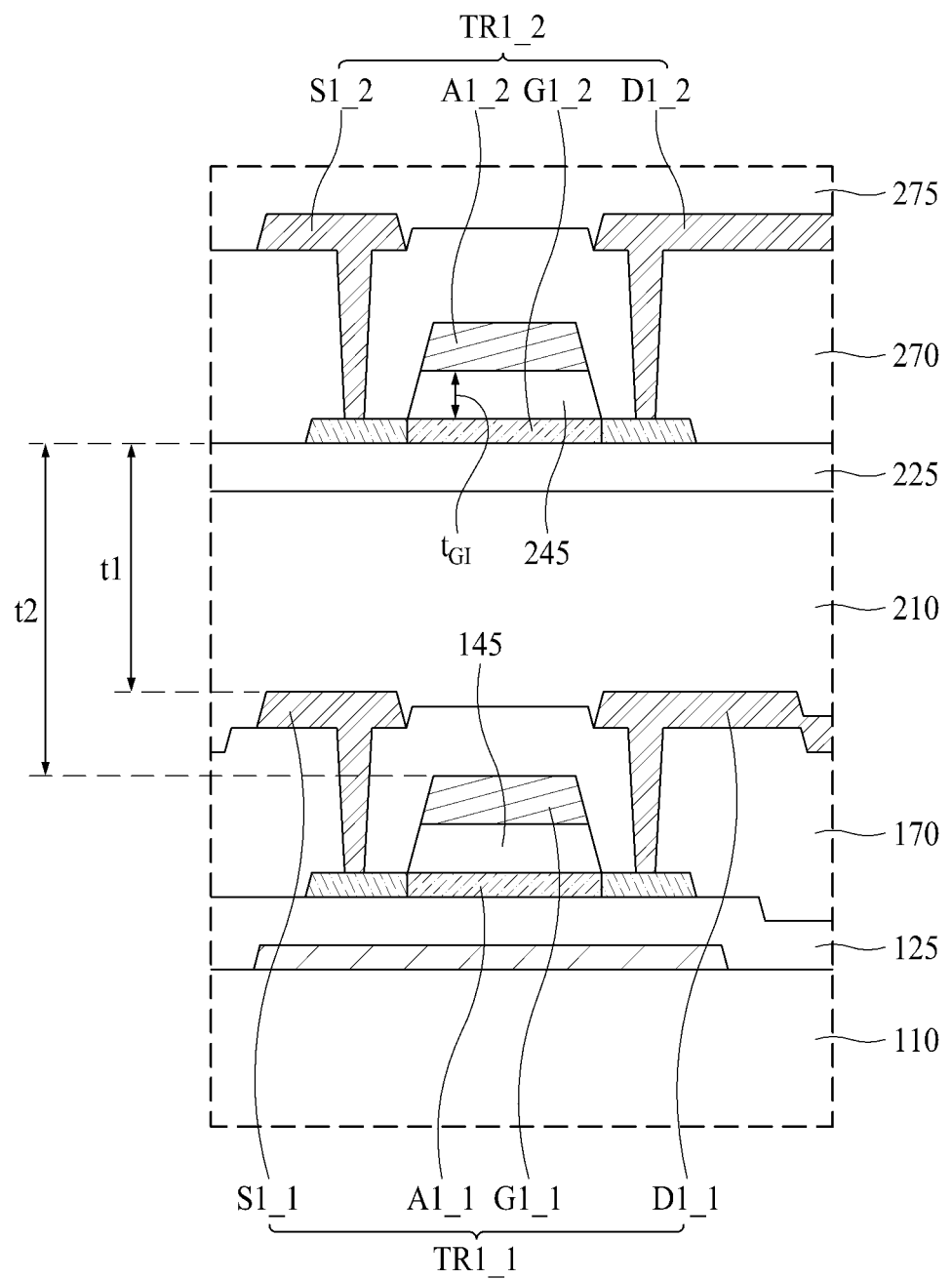
FIG. 8 is an enlarged view illustrating a portion of FIG. 7.

According to one aspect of the present disclosure, a thickness 't' of the electric field blocking layer 210 is defined as a distance from an upper surface of the first pixel driving circuit PDC1 to a lower surface of the second pixel driving circuit PDC2. Referring to FIG. 8, a distance t1 from the upper surface of the first thin film transistor TR1_1 of the first pixel driving circuit PDC1 to the lower surface of the first thin film transistor TR1_2 of the second pixel driving circuit PDC2 may be defined as the thickness 't' of the electric field blocking layer 210.

The thickness 't' of the electric field blocking layer 210 may be proportional to a dielectric constant κ of the electric field blocking layer 210, as described above. Considering that a dielectric constant of silicon oxide ($SiO_2$) widely used as an insulating layer is about 3.9, the thickness 't' of the electric field blocking layer 210 may be expressed as a ratio of the dielectric constant κ of the electric field blocking layer 210 to 3.9 [κ/3.9].

Referring to FIG. 8, the first thin film transistor TR1_2 of the second pixel driving circuit PDC2 is affected by a voltage VGH applied to the gate electrode G1_1 to turn on the first thin film transistor TR1_1 of the first pixel driving circuit PDC1. In this case, the voltage applied to the gate electrode G1_1 to turn on the first thin film transistor TR1_1 of the first pixel driving circuit PDC1_1 is referred to as a turn-on voltage $V_{GH}$ applied to the first thin film transistor TR1_1 of the first pixel driving circuit PDC1. The greater the turn-on voltage $V_{GH}$ applied to the first thin film transistor TR1_1 of the first pixel driving circuit PDC1 is, the greater the degree of the influence to the first thin film transistor TR1_2 of the second pixel driving circuit PDC2 affected by the voltage $V_{GH}$ will be. In addition, the greater a threshold voltage $V_{TH}$ of the first thin film transistor TR1_2 of the second pixel driving circuit PDC2 is, the smaller the degree of the influence to the first thin film transistor TR1_2 of the second pixel driving circuit PDC2 affected by an external electric field may be.

In addition, the active layer A1_2 serving as a channel of the first thin film transistor TR1_2 of the second pixel driving circuit PDC2 is directly affected by the gate electrode G1_2, and a distance between the gate electrode G1_2 and the active layer A1_2 is equal to a thickness tGI of the gate insulating layer 245. Therefore, the thickness 't' of the electric field blocking layer 210 may be expressed by the thickness $t_{GI}$ of the gate insulating layer included in the first thin film transistor TR1_2 of the second pixel driving circuit PDC2.

In consideration of these features, the distance t1 between the upper surface of the first thin film transistor TR1_1 of the first pixel driving circuit PDC1 and the lower surface of the first thin film transistor TR1_2 of the second pixel driving circuit PDC2 may satisfy the following equation 1.

$$t1 = t \geq (V_{GH}/V_{TH}) \times (\kappa/3.9) \times (t_{GI})$$ [Equation 1]

In the Equation 1, κ denotes a dielectric constant of the electric field blocking layer 210, $V_{GH}$ is a turn-on voltage applied to the first thin film transistor TR1_1 of the first pixel driving circuit PDC1, $V_{TH}$ is a threshold voltage of the first thin film transistor TR1_2 of the second pixel driving circuit PDC2 and $t_{GI}$ is a distance between the gate electrode G1_2 and the active layer A1_2 of the first thin film transistor TR1_2 of the second pixel driving circuit PDC2.

According to one aspect of the present disclosure, the thickness t1 of the electric field blocking layer 210 may be 1 μm or more.

The electric field blocking layer 210 planarizes upper portions of the first thin film transistor TR1_1 and the second thin film transistor TR2_1, and protects the first thin film transistor TR1_1 and the second thin film transistor TR2_1.

A buffer layer 225 of the second pixel driving circuit PDC2 is disposed on the electric field blocking layer 210. The buffer layer 225 is made of an insulating material, and protects the active layers A1_2 and A2_2 from external moisture or oxygen. The buffer layer 225 may be omitted.

The first thin film transistor TR1_2 and the second thin film transistor TR2_2 of the second pixel driving circuit PDC2 are disposed on the buffer layer 225. In detail, the active layer A1_2 of the first thin film transistor TR1_2 and the active layer A2_2 of the second thin film transistor TR2_2 are disposed on the buffer layer 225.

The active layers A1_2 and A2_2 may include an oxide semiconductor material. According to one aspect of the present disclosure, the active layers A1_2 and A2_2 may be oxide semiconductor layers made of an oxide semiconductor material.

The gate insulating layer 245 is disposed on the active layers A1_2 and A2_2. The gate insulating layer 245 has insulation properties, and spaces the active layers A1_2 and A2_2 apart from the gate electrodes G1_2 and G2_2. A patterned gate insulating layer 245 is shown in FIG. 7, but one aspect of the present disclosure is not limited thereto. The gate insulating layer 245 may not be patterned.

The gate electrode G1_2 of the first thin film transistor TR1_2 and the gate electrode G2_2 of the second thin film transistor TR2_2 are disposed on the gate insulating layer 245.

The gate electrode G1_2 of the first thin film transistor TR1_2 is spaced apart from the active layer A1_2 of the first thin film transistor TR1_2 and overlaps at least a portion of the active layer A1_2 of the first thin film transistor TR1_2.

The gate electrode G2_2 of the second thin film transistor TR2_2 is spaced apart from the active layer A2_2 of the second thin film transistor TR2_2 and overlaps at least a portion of the active layer A2_2 of the second thin film transistor TR2_2.

Referring to FIG. 7, a first capacitor electrode CE12 of a first capacitor C1_2 is disposed in the same layer as the gate electrodes G1_2 and G2_2. The gate electrodes G1_2 and G2_2 and the first capacitor electrodes CE12 may be made together by the same process using the same material.

An interlayer dielectric layer 270 is disposed on the gate electrodes G1_2 and G2_2 and the first capacitor electrode CE12.

Source electrodes S1_2 and S2_2 and drain electrodes D1_2 and D2_2 are disposed on the interlayer dielectric layer 270. According to one aspect of the present disclosure, the source electrodes S1_2 and S2_2 and the drain electrodes D1_2 and D2_2 are distinguished for convenience of description, and the source electrodes S1_2 and S2_2 and the drain electrodes D1_2 and D2_2 may be used interchangeably. Therefore, the source electrodes S1_2 and S2_2 may be the drain electrodes D1_2 and D2_2, and the drain electrodes D1_2 and D2_2 may be the source electrodes S1_2 and S2_2.

A data line DL_2 and a driving power line PL_2 are disposed on the interlayer dielectric layer 270. The source electrode S1_2 of the first thin film transistor TR1_2 may integrally be formed with the data line DL_2. The drain electrode D2_2 of the second thin film transistor TR2_2 may integrally be formed with the driving power line PL_2.

According to one aspect of the present disclosure, the source electrode S1_2 and the drain electrode D1_2 of the first thin film transistor TR1_2 are spaced apart from each other and connected with the active layer A1_2 of the first thin film transistor TR1_2. The source electrode S2_2 and the drain electrode D2_2 of the second thin film transistor TR2_2 are spaced apart from each other and connected with the active layer A2_2 of the second thin film transistor TR2_2.

In detail, the source electrode S1_2 of the first thin film transistor TR1_2 is in contact with a source area of the active layer A1_2 through a first contact hole H1_2.

The drain electrode D1_2 of the first thin film transistor TR1_2 is in contact with a drain area of the active layer A1_2 through a second contact hole H2_2, and is connected with the first capacitor electrode CE12 of the first capacitor C1_2 through a third contact hole H3_2.

The source electrode S2_2 of the second thin film transistor TR2_2 is in contact with a source area of the active layer A2_2 through a fourth contact hole H4_2.

The source electrode S2_2 of the second thin film transistor TR2_2 is extended onto the interlayer dielectric layer 270, and a portion of the source electrode S2_2 of the second thin film transistor TR2_2 serves as a second capacitor electrode CE22 of the first capacitor C1_2. The first capacitor electrode CE12 and the second capacitor electrode CE22 are overlapped with each other to form the first capacitor C1_2.

The drain electrode D2_2 of the second thin film transistor TR2_2 is in contact with a drain area of the active layer A2_2 through a fifth contact hole H5_2.

The first thin film transistor TR1_2 includes an active layer A1_2, a gate electrode G1_2, a source electrode S1_2 and a drain electrode D1_2, and serves as a switching transistor for controlling a data voltage Vdata applied to the second pixel driving circuit PDC2.

The second thin film transistor TR2_2 includes an active layer A2_2, a gate electrode G2_2, a source electrode S2_2 and a drain electrode D2_2, and serves as a driving transistor for controlling a driving voltage Vdd applied to the second display element DU2.

Referring to FIGS. 5 and 7, a second bridge BR2 is formed on the interlayer dielectric layer 270. Referring to FIG. 7, the second bridge BR2 is connected with the first bridge BR1 through a first portion CT11 of the first connection portion CT1.

A passivation layer 275 is disposed on the source electrodes S1_2 and S2_2, the drain electrodes D1_2 and D2_2, the data line DL_2, the driving power line PL_2 and the second bridge BR2 of the second pixel driving circuit PDC2. The passivation layer 275 planarizes upper portions of the first thin film transistor TR1_2 and the second thin film transistor TR2_2, and protects the first thin film transistor TR1_2 and the second thin film transistor TR2_2.

According to one aspect of the present disclosure, one thin film transistor TR1_1 or TR2_1 of the first pixel driving circuit PDC1 and one thin film transistor TR1_2 or TR2_2 of the second pixel driving circuit PDC2 may overlap each other. Referring to FIG. 7, the first thin film transistor TR1_1 of the first pixel driving circuit PDC1 overlaps the first thin film transistor TR1_2 of the second pixel driving circuit PDC2. In addition, the second thin film transistor TR2_1 of the first pixel driving circuit PDC1 overlaps the second thin film transistor TR2_2 of the second pixel driving circuit PDC2.

In order to prevent the thin film transistors overlapped with each other from being electrically affected by each other, according to one aspect of the present disclosure, the thin film transistors are spaced apart from each other at a predetermined interval or more. In particular, the gate electrode of any one of the thin film transistors overlapped with each other is spaced apart from the active layer of the other thin film transistor at a predetermined interval or more.

According to one aspect of the present disclosure, spaced distances between the gate electrodes G1_1 and G2_1 of the thin film transistors TR1_1 and TR2_1 of the first pixel driving circuit PDC1 and the active layers A1_2 and A2_2 of the thin film transistors TR1_2 and TR2_2 of the second pixel driving circuit PDC2 may be 1 μm or more.

In more detail, referring to FIGS. 7 and 8, a spaced distance t2 between the gate electrode G1_1 of the first thin film transistor TR1_1 of the first pixel driving circuit PDC1 and the active layer A1_2 of the first thin film transistor TR1_2 of the second pixel driving circuit PDC2 is 1 μm or more. In addition, a spaced distance between the gate electrode G2_1 of the second thin film transistor TR2_1 of the first pixel driving circuit PDC1 and the active layer A2_2 of the second thin film transistor TR2_2 of the second pixel driving circuit PDC2 is 1 μm or more.

When the electric field blocking layer 210 according to one aspect of the present disclosure is applied and the distance between the gate electrodes G1_1 and G1_2 of one of the thin film transistors TR1_1 and TR1_2 and the active layers A1_2 and A1_1 of the other thin film transistor is 1 μm or more, the gate electrodes G1_1 and G1_2 of one thin film transistor may be prevented from affecting the active layers A1_2 and A1_1 of the other thin film transistor. As a result, each thin film transistor may stably be driven.

A first electrode 711 of the first display element DU1 and a first electrode 712 of the second display element DU2 are disposed on the passivation layer 275.

The first electrode 711 of the first display element DU1 is connected with the second bridge BR2 through a second portion CT12 of the first connection portion CT1. As a result, the first display element DU1 may be connected with the second thin film transistor TR2_1 of the first pixel driving circuit PDC1 through the second bridge BR2 and the first bridge BR1.

The second portion CT12 of the first connection portion CT1 may be formed in a contact hole formed in the passivation layer 275. The first portion CT11 of the first connection portion CT1 may be disposed in a contact hole passing through the interlayer dielectric layer 270, the buffer layer 225 and the electric field blocking layer 210. The first portion CT11 of the first connection portion CT1 may be disposed in a contact hole formed in the second pixel driving circuit PDC2.

According to one aspect of the present disclosure, the first connection portion CT1 includes a first portion CT11 and a second portion CT12. Therefore, according to one aspect of the present disclosure, the first display element DU1 is connected with the first pixel driving circuit PDC1 by the first connection portion CT1.

The first electrode 712 of the second display element DU2 is connected with the source electrode S2_2 of the second thin film transistor TR2_2 of the second pixel driving circuit PDC2 through the second connection portion CT2. Therefore, according to one aspect of the present disclosure, the second display element DU2 may be connected with the second pixel driving circuit PDC2 through the second connection portion CT2. The second connection portion CT2 may be disposed in a contact hole formed in the passivation layer 275.

A bank layer 750 is disposed around the first electrode 711 of the first display element DU1 and the first electrode 712 of the second display element DU2. The bank layer 750 defines light emission areas of the display elements DU1 and DU2. According to one aspect of the present disclosure, the area exposed from the bank layer 750 may be referred to as a light emission area. According to one aspect of the present disclosure, light is emitted from the area exposed from the bank layer 750 without being covered by the bank layer 750 of the first electrode 711 of the first display element DU1 and the first electrode 712 of the second display element DU2. Therefore, according to one aspect of the present disclosure, the area exposed from the bank layer 750 of the first electrode 711 of the first display element DU1 may be referred to as a light emission area of the first display element DU1 and the area exposed from the bank layer 750 of the first electrode 712 of the second display element DU2 may be referred to as a light emission area of the second display element DU2.

Although the bank layer 750 is exemplarily shown in FIG. 7, the position of the bank layer 750 is not limited by FIG. 7. According to one aspect of the present disclosure, the bank layer 750 may be disposed to overlap at least one of the first connection portion CT1 and the second connection portion CT2.

According to one aspect of the present disclosure, the first connection portion CT1 and the second connection portion CT2 are formed in the contact hole, and the portion in which the contact hole is formed may not be flat. Therefore, the first connection portion CT1 and the second connection portion CT2 may be disposed in the areas overlapped with the bank layer 750 not the light emission areas, and thus the first electrode 711 of the first display element DU1 and the first electrode 712 of the second display element DU2 can be planarized in the light emission area, and resultingly a first organic light emitting layer 721 and a second organic light emitting layer 722 may be planarized.

For example, as shown in FIG. 3, at least one of the first connection portion CT1 and the second connection portion CT2 may be disposed below the bank layer 750. In more detail, at least a portion of the first connection portion CT1 may overlap the bank layer 750. In particular, the first portion CT11 of the first connection portion CT1 may overlap the bank layer 750. According to one aspect of the present disclosure, the first connection portion CT1 may fully overlap the bank layer 750, and both the first connection portion CT1 and the second connection portion CT2 may overlap the bank layer 750.

According to one aspect of the present disclosure, the first connection portion CT1 connects the first display element DU1 with the first pixel driving circuit PDC1. Since the first pixel driving circuit PDC1 is disposed to be closer to the substrate 110 than the second pixel driving circuit PDC2, the first pixel driving circuit PDC1 may be disposed below the second pixel driving circuit PDC2. Therefore, the contact hole in which the first connection portion CT1 is positioned is relatively deep. If the contact hole is deep, an uneven surface that is not flat may be likely to occur around the contact hole. Therefore, according to one aspect of the present disclosure, the first connection portion CT1 is disposed below the bank layer 750 so that the uneven surface by the first connection portion CT1 is covered by the bank layer 750.

According to one aspect of the present disclosure, the first connection portion CT1 includes a first portion CT11 and a second portion CT12. In this case, the first portion CT11 formed to pass through the electric field blocking layer 210 may be deeper than the second portion CT12. Therefore, according to one aspect of the present disclosure, the first portion CT11 of the first connection portion CT1 passing through the electric field blocking layer 210 may overlap the bank layer 750.

The first organic light emitting layer 721 is disposed on the first electrode 711 of the first display element DU1. The second organic light emitting layer 722 is disposed on the first electrode 712 of the second display element DU2. The first display element DU1 includes the first organic light emitting layer 721, and the second display element DU2 includes the second organic light emitting layer 722.

Second electrodes 731 and 732 are disposed on the first organic light emitting layer 721 and the second organic light emitting layer 722. In detail, the second electrode 731 is disposed on the first organic light emitting layer 721 of the first display element DU1, and the second electrode 732 is disposed on the second organic light emitting layer 722 of the second display element DU2. The second electrode 731 of the first display element DU1 and the second electrode 732 of the second display element DU2 may integrally be formed. The second electrodes 731 and 732 may integrally be formed throughout the display apparatus 100.

The display elements DU1 and DU2 shown in FIG. 7 are organic light emitting diodes (OLED). Therefore, the display apparatus 100 according to one aspect of the present disclosure is an organic light emitting display apparatus.

Although not shown, a color filter may be disposed in a path through which light emitted from the display elements DU1 and DU2 passes. The color filter may have one of red, green and blue colors, for example.

According to one aspect of the present disclosure, each of the first electrode 711 of the first display element DU1 and the first electrode 712 of the second display element DU2 may have a reflective layer (not shown). For example, the first electrode 711 of the first display element DU1 and the first electrode 712 of the second display element DU2 may have a structure in which a layer of transparent conductive oxide (TCO) and a layer of reflective metal are alternately deposited. In more detail, the first electrode 711 of the first display element DU1 and the first electrode 712 of the second display element DU2 may have a structure in which an ITO (InSnO) layer, a reflective metal layer and an ITO (InSnO) layer are alternately deposited.

In addition, each of the second electrode 731 of the first display element DU1 and the second electrode 732 of the second display element DU2 may be formed of a transflective conductive layer. As a result, light generated from the first organic light emitting layer 721 and the second organic light emitting layer 722 may be emitted to the outside through the second electrodes 731 and 732, respectively.

As described above, the display apparatus 100 having a structure for emitting light generated from the display elements DU1 and DU2 to the outside through the second electrodes 731 and 732 is referred to as a top emission type display apparatus. The display apparatus 100 according to one aspect of the present disclosure is a top emission type display apparatus, and the light generated from the display elements DU1 and DU2 is emitted in an opposite direction of the substrate 110. Alternatively, the display apparatus 100 according to one aspect of the present disclosure may be a top emission type display apparatus, and the light generated from the display elements DU1 and DU2 may be emitted in an opposite direction of the pixel driving circuits PDC1 and PDC2.

Figure 9:
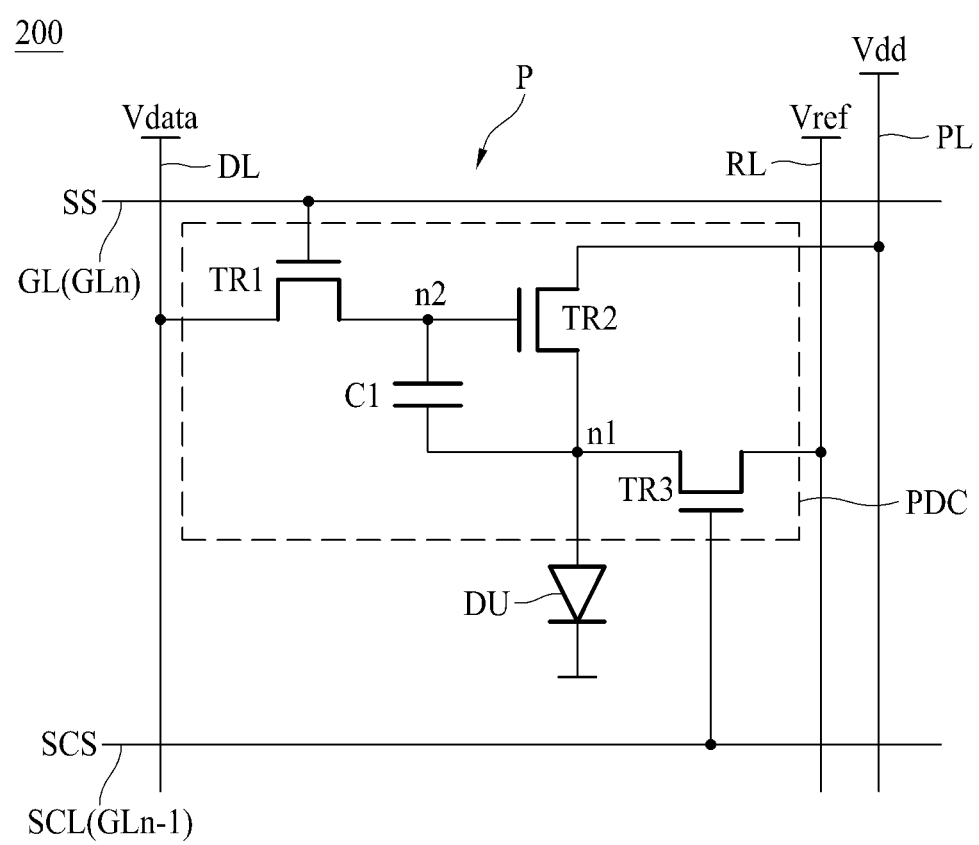
FIG. 9 is a circuit view illustrating a pixel of a display apparatus according to another aspect of the present disclosure.

FIG. 9 is a circuit view of a pixel P of a display apparatus 200 according to another aspect of the present disclosure. Hereinafter, the description of the previously described element will be omitted to avoid redundancy.

FIG. 9 is an equivalent circuit view illustrating a pixel P of an organic light emitting display apparatus.

The pixel P of the display apparatus 200 shown in FIG. 9 includes an organic light emitting diode (OLED) that is a display element DU, and a pixel driving circuit PDC for driving the display element DU. The display element DU is connected with the pixel driving circuit PDC. The pixel P shown in FIG. 9 may be the first pixel P1 or the second pixel P2 shown in FIG. 3.

Referring to FIG. 9, in the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 9, assuming that a gate line of an nth pixel P is "GLn", a gate line of a (n−1)th pixel P adjacent to the nth pixel P is "GLn−1", and the gate line "GLn−1" of the (n−1)th pixel P serves as a sensing control line SCL of the nth pixel P.

The pixel driving circuit PDC, for example, includes a first thin film transistor TR1 (switching transistor) connected with the gate line GL and the data line DL, a second thin film transistor TR2 (driving transistor) for controlling a magnitude of a current output to the display element DU in accordance with the data voltage Vdata transmitted through the first thin film transistor TR1, and a third thin film transistor TR3 (reference transistor) for sensing characteristics of the second thin film transistor TR2.

A first capacitor C1 is disposed between a gate electrode of the second thin film transistor TR2 and the display element DU. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element DU and the reference line RL and thus turned on or off by the sensing control signal SCS, and senses characteristics of the second thin film transistor TR2, which is a driving transistor, for a sensing period.

A second node n2 connected with the gate electrode of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the first capacitor C1 formed between the gate electrode and the source electrode of the second thin film transistor TR2.

When the second thin film transistor TR2 is turned on, the current is supplied to the display element DU through the second thin film transistor TR2 in accordance with the driving voltage Vdd for driving the pixel, whereby light is output from the display element DU.

Figure 10:
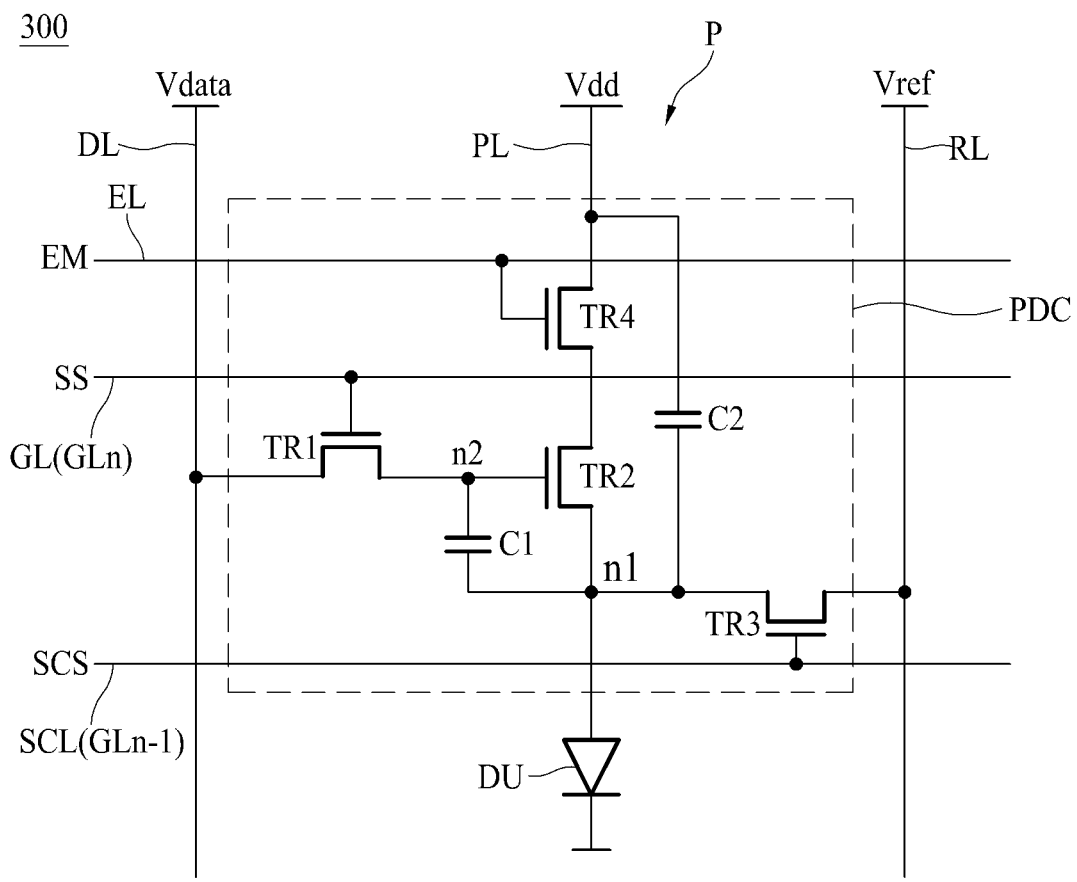
FIG. 10 is a circuit view illustrating a pixel of a display apparatus according to still another aspect of the present disclosure.

FIG. 10 is a circuit view illustrating a pixel of a display apparatus 300 according to still another aspect of the present disclosure.

The pixel P of the display apparatus 300 shown in FIG. 10 includes an organic light emitting diode (OLED) that is a display element DU, and a pixel driving circuit PDC for driving the display element DU. The display element DU is connected with the pixel driving circuit PDC. The pixel P shown in FIG. 10 may be the first pixel P1 or the second pixel P2 shown in FIG. 3.

The pixel driving circuit PDC includes thin film transistors TR1, TR2, TR3 and TR4.

In the pixel P shown in FIG. 10, signal lines DL, EL, GL, PL, SCL and RL for supplying a driving signal to the pixel driving circuit PDC are disposed.

In comparison with the pixel P of FIG. 9, the pixel P of FIG. 10 further includes an emission control line EL. An emission control signal EM is supplied to the emission control line EL.

Also, the pixel driving circuit PDC of FIG. 10 further includes a fourth thin film transistor TR4 that is an emission control transistor for controlling a light emission timing of the second thin film transistor TR2, in comparison with the pixel driving circuit PDC of FIG. 9.

Referring to FIG. 10, assuming that a gate line of an nth pixel P is "GLn", a gate line of a (n–1)th pixel P adjacent to the nth pixel P is "GLn–1", and the gate line "GLn–1" of the (n–1)th pixel P serves as a sensing control line SCL of the nth pixel P.

A first capacitor C1 is positioned between the gate electrode of the second thin film transistor TR2 and the display element DU. A second capacitor C2 is positioned between one of terminals of the fourth thin film transistor TR4, to which a driving voltage Vdd is supplied, and one electrode of the display element DU.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM, or shields the driving voltage Vdd. When the fourth thin film transistor is turned on, a current is supplied to the second thin film transistor TR2, whereby light is output from the display element DU.

Figure 11:
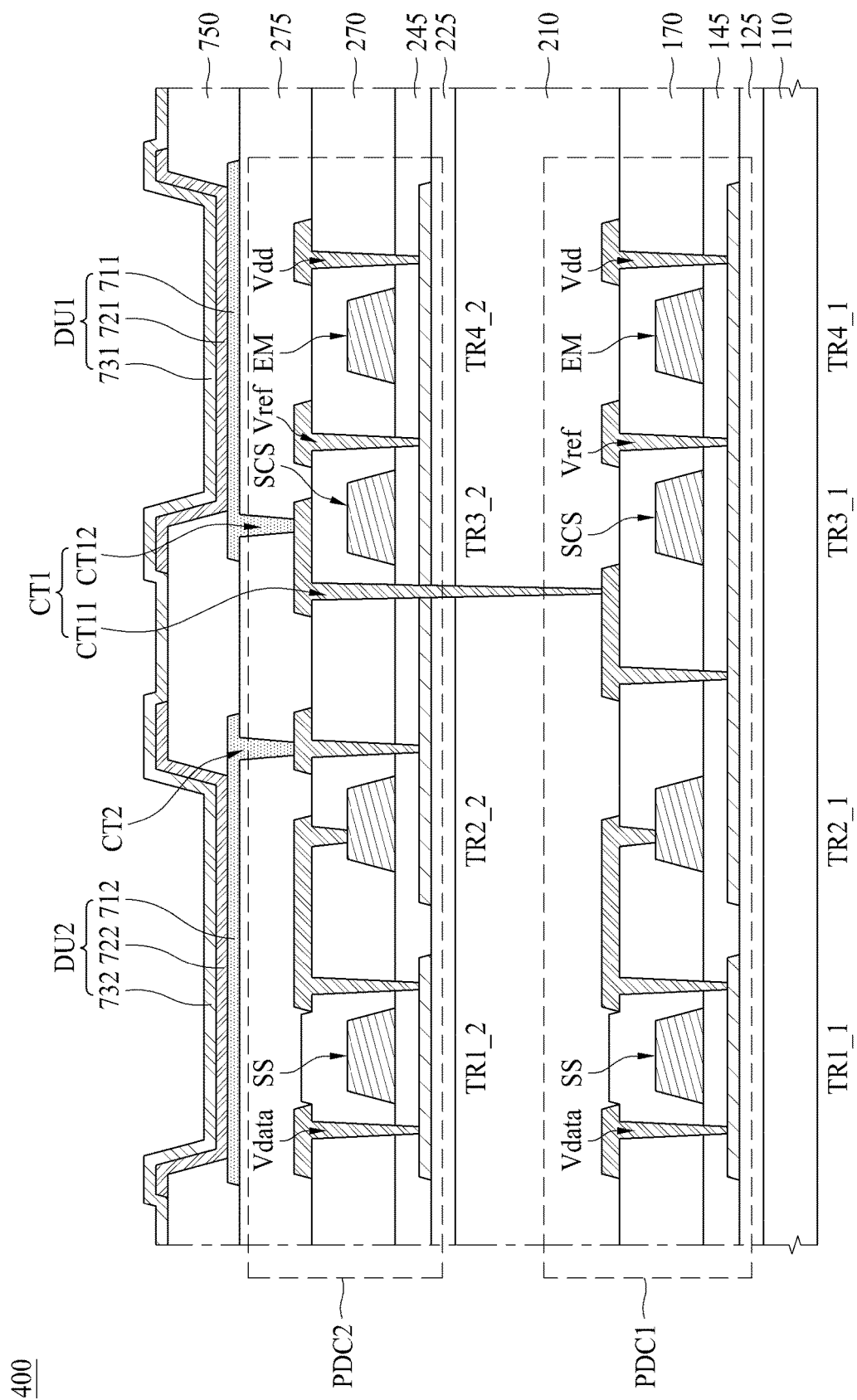
FIG. 11 is a schematic cross-sectional view illustrating one aspect of a display apparatus using the pixel of FIG. 10.

FIG. 11 is a schematic cross-sectional view illustrating one aspect of a display apparatus 400 using the pixel of FIG. 10.

Referring to FIG. 11, the display apparatus 400 according to another aspect of the present disclosure includes a first pixel driving circuit PDC1, an electric field blocking layer 210 on the first pixel driving circuit PDC1, a second pixel driving circuit PDC2 on the electric field blocking layer 210, and a first display element DU1 and a second display element DU2 on the second pixel driving circuit PDC2. The first display element DU1 and the first pixel driving circuit PDC1 are connected with each other by the first connection portion CT1, and the second display element DU2 and the second pixel driving circuit PDC2 are connected with each other by the second connection portion CT2.

The first pixel driving circuit PDC1 includes a first thin film transistor TR1_1, a second thin film transistor TR2_1, a third thin film transistor TR3_1 and a fourth thin film transistor TR4_1. The first pixel driving circuit PDC1 may have the same configuration as the pixel driving circuit PDC shown in FIG. 10. In detail, the first thin film transistor TR1_1 of the first pixel driving circuit PDC1 may serve to perform the same function as that of the first thin film transistor TR1 of FIG. 10, the second thin film transistor TR2_1 of the first pixel driving circuit PDC1 may serve to perform the same function as that of the second thin film transistor TR2 of FIG. 10, the third thin film transistor TR3_1 of the first pixel driving circuit PDC1 may serve to perform the same function as that of the third thin film transistor TR3 of FIG. 10, and the fourth thin film transistor TR4_1 of the first pixel driving circuit PDC1 may serve to perform the same function as that of the fourth thin film transistor TR4 of FIG. 10.

Referring to FIG. 11, the first pixel driving circuit PDC1 is disposed on the substrate 110. In detail, a buffer layer 125 is disposed on the substrate 110, the first thin film transistor TR1_1, the second thin film transistor TR2_1, the third thin film transistor TR 3_1 and the fourth thin film transistor TR4_1 are disposed on the buffer layer 125. In detail, an active layer is disposed on the buffer layer 125, a gate insulating layer 145 is disposed on the active layer, a gate electrode is disposed on the gate insulating layer 145, an interlayer dielectric layer 170 is disposed on the gate electrode, and a source electrode and a drain electrode are disposed on the interlayer dielectric layer 170.

The electric field blocking layer 210 is disposed on the first thin film transistor TR1_1, the second thin film transistor TR2_1, the third thin film transistor TR3_1 and the fourth thin film transistor TR4_1, which constitute the first pixel driving circuit PDC1.

A buffer layer 225 is disposed on the electric field blocking layer 210, and a first thin film transistor TR1_2, a second thin film transistor TR2_2, a third thin film transistor TR 3_2 and a fourth thin film transistor TR 4_2 are disposed on the buffer layer 225. In detail, an active layer is disposed on the buffer layer 225, a gate insulating layer 245 is disposed on the active layer, a gate electrode is disposed on the gate insulating layer 245, an interlayer dielectric layer 270 is disposed on the gate electrode, a source electrode and a drain electrode are disposed on the interlayer dielectric layer 270, and a passivation layer 275 is disposed on the source electrode and the drain electrode.

The first and second display elements DU1 and DU2 are disposed on the passivation layer 275. The first display element DU1 includes a first electrode 711, a first organic light emitting layer 721 and a second electrode 731. The second display element DU2 includes a first electrode 712, a second organic light emitting layer 722 and a second electrode 732.

The first display element DU1 is connected with the first pixel driving circuit PDC1 through the first connection portion CT1, and the second display element DU2 is connected with the second pixel driving circuit PDC2 through the second connection portion CT2. Referring to FIG. 11, at least one of the first connection portion CT1 and the second connection portion CT2 may be disposed below the bank layer 750. In more detail, at least a portion of the first connection portion CT1 may overlap the bank layer 750. In particular, the first connection portion CT1 may include a first portion CT11 and a second portion CT12, and the first portion CT11 of the first connection portion CT1 may overlap the bank layer 750. In the display apparatus 400 according to another aspect of the present disclosure shown in FIG. 11, both the first connection portion CT1 and the second connection portion CT2 may overlap the bank layer 750.

According to another aspect of the present disclosure, each of the first electrode 711 of the first display element DU1 and the first electrode 712 of the second display element DU2 may have a reflective layer (not shown). For example, the first electrode 711 of the first display element DU1 and the first electrode 712 of the second display element DU2 may have a structure in which an ITO(InSnO) layer, a reflective metal layer and an ITO(InSnO) layer are alternately deposited.

In addition, each of the second electrode 731 of the first display element DU1 and the second electrode 732 of the second display element DU2 may be formed of a transflective conductive layer. As a result, light generated from the first organic light emitting layer 721 and the second organic light emitting layer 722 may be emitted to the outside through the second electrodes 731 and 732, respectively.

As described above, the display apparatus 400 having a structure for emitting light generated from the display elements DU1 and DU2 to the outside through the second electrodes 731 and 732 is referred to as a top emission type display apparatus. The display apparatus 400 according to another aspect of the present disclosure is a top emission type display apparatus, and the light generated from the display elements DU1 and DU2 is emitted in an opposite direction of the substrate 110. Alternatively, the display apparatus 400 according to another aspect of the present disclosure is a top emission type display apparatus, and the light generated from the display elements DU1 and DU2 is emitted in an opposite direction of the pixel driving circuit PDC1 and PDC2.

The pixel driving circuit PDC, the first pixel driving circuit PDC1 and the second pixel driving circuit PDC2 according to another aspect of the present disclosure may be formed in various structures other than those described above. The pixel driving circuit PDC, the first pixel driving circuit PDC1 and the second pixel driving circuit PDC2 may include, for example, five or more thin film transistors.

Figure 12:
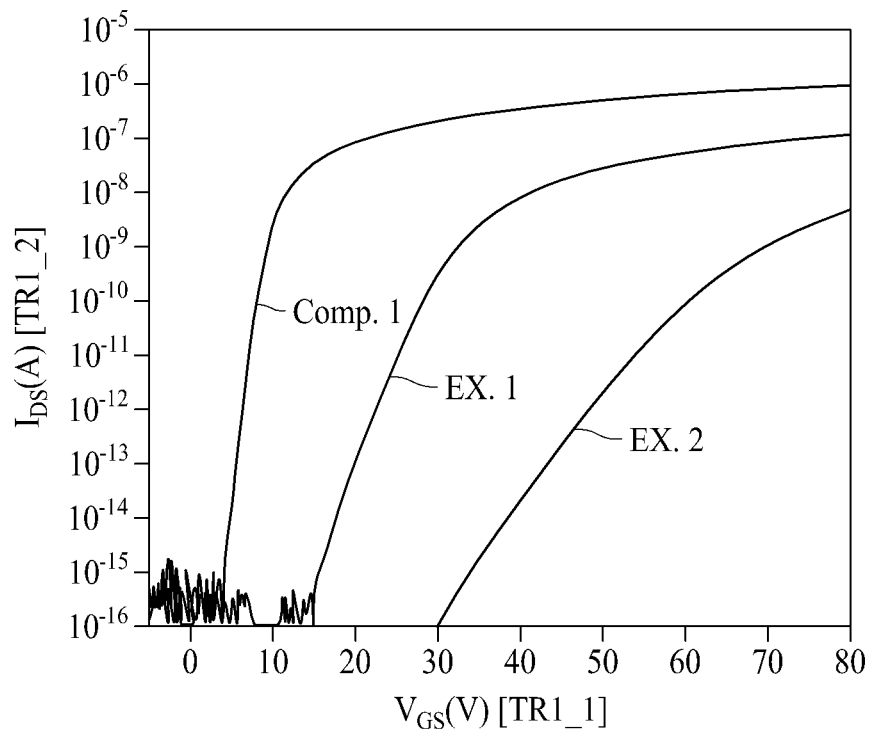
FIG. 12 is a voltage-current graph illustrating thin film transistors according to an aspect and a comparative example.

FIG. 12 is a voltage-current graph illustrating thin film transistors according to an aspect and a comparative example. FIG. 12 illustrates a degree of the second pixel driving circuit PDC2 affected by the first pixel driving circuit PDC1.

In detail, the graphs of FIG. 12 indicate a drain-source current IDS of the first thin film transistor TR1_2 of the second pixel driving circuit PDC2 when a voltage $V_{GS}$ is applied to a gate electrode G1_1 of the first thin film transistor TR1_1 of the first pixel driving circuit PDC1 in the display apparatus 400 shown in FIG. 11. Referring to FIG. 12, a voltage is not applied to a gate electrode G1_2 of the first thin film transistor TR1_2 of the second pixel driving circuit PDC2.

In FIG. 12, "EX. 1" refers to Aspect 1 in which a thickness of the electric field blocking layer 210 is 1.0 μm, "EX. 2" refers to Aspect 2 in which the thickness of the electric field blocking layer 210 is 2 μm, and "Comp. 1" refers to Comparative Example 1 in which the electric field blocking layer 210 is not disposed.

Referring to "Comp. 1" in FIG. 12, it is noted that the drain-source current IDS is easily generated in the first thin film transistor TR1_2 of the second pixel driving circuit PDC2 by the voltage $V_{GS}$ applied to the gate electrode G1_1 of the first thin film transistor TR1_1 of the first pixel driving circuit PDC1 even though no voltage is applied to the gate electrode G1_2 of the first thin film transistor TR1_2 of the second pixel driving circuit PDC2.

Referring to "EX. 1" in FIG. 12, it is noted that the drain-source current IDS is generated in the first thin film transistor TR1_2 of the second pixel driving circuit PDC2 when the voltage $V_{GS}$ applied to the gate electrode G1_1 of the first thin film transistor TR1_1 of the first pixel driving circuit PDC1 is greater than a threshold voltage 0V as much as 15V or more.

Referring to "EX. 2" in FIG. 12, it is noted that the drain-source current IDS is generated in the first thin film transistor TR1_2 of the second pixel driving circuit PDC2 when the voltage $V_{GS}$ applied to the gate electrode G1_1 of the first thin film transistor TR1_1 of the first pixel driving circuit PDC1 is greater than the threshold voltage 0V as much as 30V or more.

In this way, when the electric field blocking layer 210 is not disposed between the first pixel driving circuit PDC1 and the second pixel driving circuit PDC2, it is noted that the second pixel driving circuit PDC2 may is easily affected by the first pixel driving circuit PDC1. In addition, when the thickness of the electric field blocking layer 210 is increased, it is noted that the first pixel driving circuit PDC1 may have a smaller degree of influence on the second pixel driving circuit PDC2. In addition, when the thickness of the electric field blocking layer 210 is 1.0 μm or more, it is noted that the first pixel driving circuit PDC1 has a small degree of influence on the second pixel driving circuit PDC2 and thus the influence may be ignored.

Figure 13A:
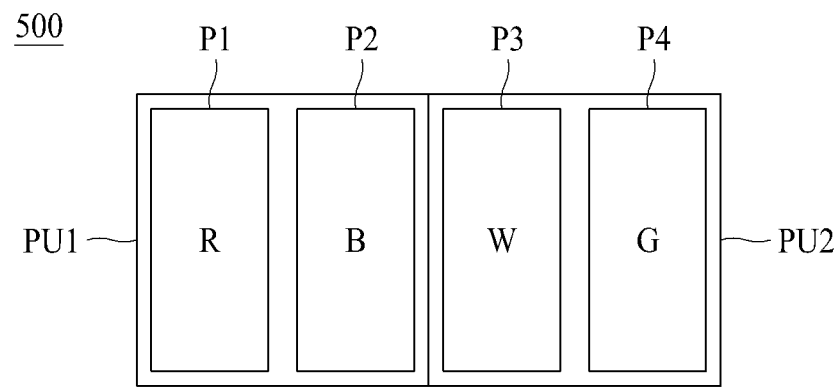
FIG. 13A is a plan view illustrating a pixel array of a display apparatus according to another aspect of the present disclosure.
Figure 13B:
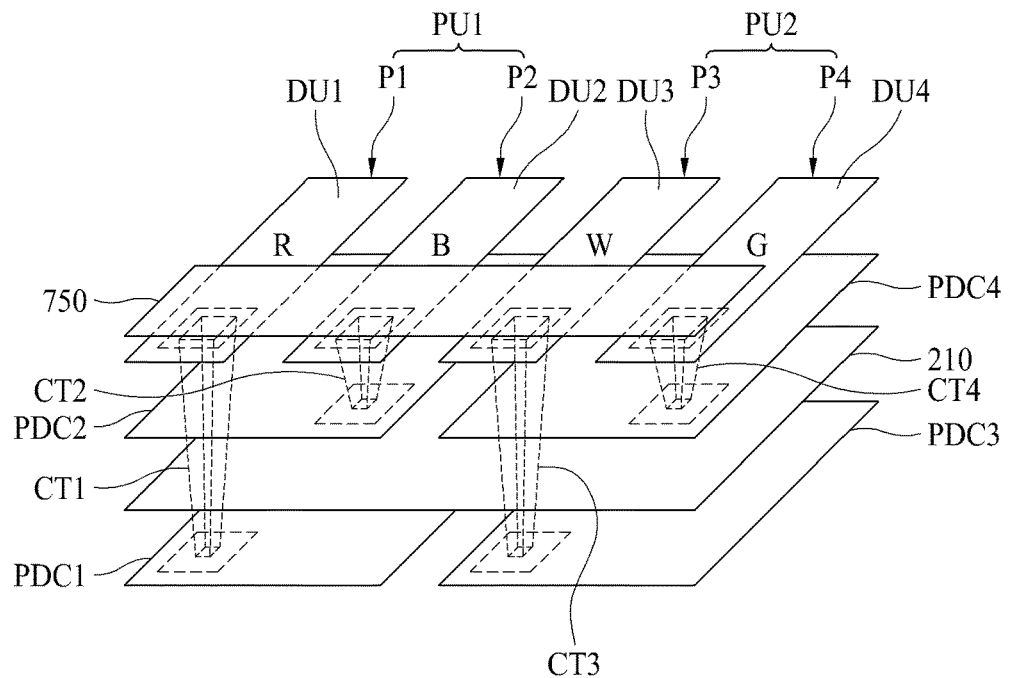
FIG. 13B is a schematic perspective view of FIG. 13A.

FIG. 13A is a plan view illustrating a pixel array of a display apparatus according to another aspect of the present disclosure, and FIG. 13B is a schematic perspective view of FIG. 13A.

The display apparatus 500 shown in FIGS. 13A and 13B includes a first display unit PU1 having a first pixel P1 and a second pixel P2, and a second display unit PU2 having a third pixel P3 and a fourth pixel P4. The first pixel P1 and the second pixel P2 of FIGS. 13A and 13B may be the same as the first pixel P1 and the second pixel P2 shown in FIG. 3 or 4, respectively. In addition, the third pixel P3 and the fourth pixel P4 of FIGS. 13A and 13B may be the same as the first pixel P1 and the second pixel P2 shown in FIG. 3 or 4, respectively.

Referring to FIGS. 13A and 13B, the display apparatus 500 according to another aspect of the present disclosure includes a first pixel P1, a second pixel P2, a third pixel P3 and a fourth pixel P4.

The first pixel P1 includes a first pixel driving circuit PDC1 and a first display element DU1 connected with the first pixel driving circuit PDC1. Referring to FIG. 13B, the first display element DU1 and the first pixel driving circuit PDC1 may be connected with each other by the first connection portion CT1.

The second pixel P2 includes a second pixel driving circuit PDC2 and a second display element DU2 connected with the second pixel driving circuit PDC2. Referring to FIG. 13B, the second display element DU2 and the second pixel driving circuit PDC2 may be connected with each other by the second connection portion CT2.

The third pixel P3 includes a third pixel driving circuit PDC3 and a third display element DU3 connected with the third pixel driving circuit PDC3. Referring to FIG. 13B, the third display element DU3 and the third pixel driving circuit PDC3 may be connected with each other by a third connection portion CT3.

The fourth pixel P4 includes a fourth pixel driving circuit PDC4 and a fourth display element DU4 connected with the fourth pixel driving circuit PDC4. Referring to FIG. 13B, the fourth display element DU4 and the fourth pixel driving circuit PDC4 may be connected with each other by a fourth connection portion CT4.

The display apparatus 500 according to another aspect of the present disclosure may be, for example, a top emission type display apparatus. In this case, light generated from the display elements DU1, DU2, DU3 and DU4 may be emitted in an opposite direction of the pixel driving circuits PDC1, PDC2, PDC3 and PDC4.

According to another aspect of the present disclosure, as shown in FIG. 13B, the first connection portion CT1, the second connection portion CT2, the third connection portion CT3 and the fourth connection portion CT4 may be disposed to overlap the bank layer 750.

The electric field blocking layer 210 is disposed between the first pixel driving circuit PDC1 and the second pixel driving circuit PDC2 and between the third pixel driving circuit PDC3 and the fourth pixel driving circuit PDC4. The electric field blocking layer 210 may be extended from a portion between the first pixel driving circuit PDC1 and the second pixel driving circuit PDC2 to a portion between the third pixel driving circuit PDC3 and the fourth pixel driving circuit PDC4 to form a single body. The electric field blocking layer 210 may integrally be formed over the entire surface of the display apparatus 500.

According to another aspect of the present disclosure, the first pixel driving circuit PDC1 and the second pixel driving circuit PDC2 overlap each other. Also, the third pixel driving circuit PDC3 and the fourth pixel driving circuit PDC4 overlap each other.

According to another aspect of the present disclosure, the first pixel P1 and the second pixel P2 constitute a first display unit PU1, and the third pixel P3 and the fourth pixel P4 constitute a second display unit PU2. According to another aspect of the present disclosure, as shown in FIGS. 13A and 13B, the first display unit PU1 and the second display unit PU2 are adjacent to each other.

According to another aspect of the present disclosure, the electric field blocking layer 210 may have a thickness of 1 μm or more. The thickness of the electric field blocking layer 210 may be defined as a distance between an upper surface of the first pixel driving circuit PDC1 and a lower surface of the second pixel driving circuit PDC2.

The electric field blocking layer 210 may have a dielectric constant of 3.9 or less. The electric field blocking layer 210 may have a dielectric constant of 3.5 or less, 3.0 or less, or 2.5 or less.

The electric field blocking layer 210 may include a siloxane compound. The electric field blocking layer 210 may be formed by a siloxane compound.

According to another aspect of the present disclosure, each of the first pixel driving circuit PDC1, the second pixel driving circuit PDC2, the third pixel driving circuit PDC3 and the fourth pixel driving circuit PDC4 may include two or more thin film transistors. Each of the first pixel driving circuit PDC1, the second pixel driving circuit PDC2, the third pixel driving circuit PDC3 and the fourth pixel driving circuit PDC4 may have the same circuit configuration as any one of the pixel driving circuits PDC of the circuit views shown in FIGS. 2, 9 and 10.

According to another aspect of the present disclosure, each of the first pixel driving circuit PDC1, the second pixel driving circuit PDC2, the third pixel driving circuit PDC3 and the fourth pixel driving circuit PDC4 may include four or more thin film transistors.

Each of the first pixel P1, the second pixel P2, the third pixel P3 and the fourth pixel P4 may have the same structure as any one of the pixels P shown in FIGS. 2, 9 and 10.

According to another aspect of the present disclosure, the first pixel P1 may display a first color, the second pixel P2 may display a second color, the third pixel P3 may display a third color, and the fourth pixel P4 may display a fourth color. According to another aspect of the present disclosure, the first color, the second color, the third color and the fourth color may be different from one another. For example, one of the first color, the second color, the third color and the fourth color may be a white color W. In addition, one of the first color, the second color, the third color and the fourth color may be a red color R, another one may be a green color G, and still another one may be a blue color B.

Figure 14:
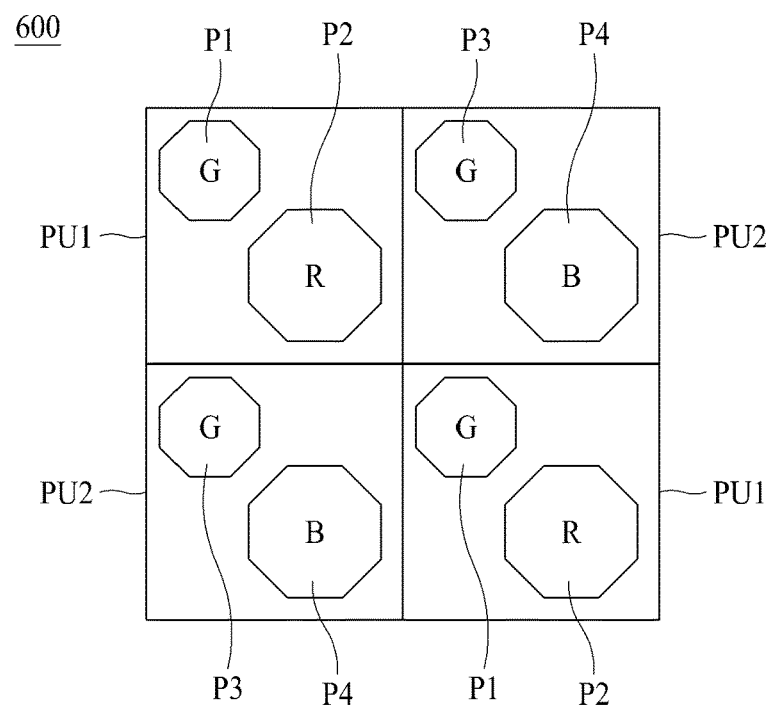
FIG. 14 is a plan view illustrating a pixel array of a display apparatus according to still another aspect of the present disclosure.

FIG. 14 is a plan view illustrating a pixel array of a display apparatus 600 according to still another aspect of the present disclosure. The display apparatus 600 according to still another aspect of the present disclosure includes a first pixel P1, a second pixel P2, a third pixel P3 and a fourth pixel P4. Referring to FIG. 14, the first display unit PU1 includes a first pixel P1 and a second pixel P2, and the second display unit PU2 includes a third pixel P3 and a fourth pixel P4.

In the display apparatus 600 shown in FIG. 14, a deposited structure of the first pixel P1, the second pixel P2, the third pixel P3 and the fourth pixel P4 may be the same as the deposited structure shown in FIG. 13B.

According to another aspect of the present disclosure, the first pixel P1 may display a first color, the second pixel P2 may display a second color, the third pixel P3 may display a first color, and the fourth pixel P4 may display a third color. In this case, the first color may be a green color G, one of the second color and the third color may be a red color R, and the other may be a blue color B.

Referring to FIG. 14, the first pixel P1, the second pixel P2, the third pixel P3 and the fourth pixel P4, which constitute the first display unit PU1 and the second display unit PU2, may be disposed to display colors in the order of, for example, green, red, green and blue.

Figure 15:
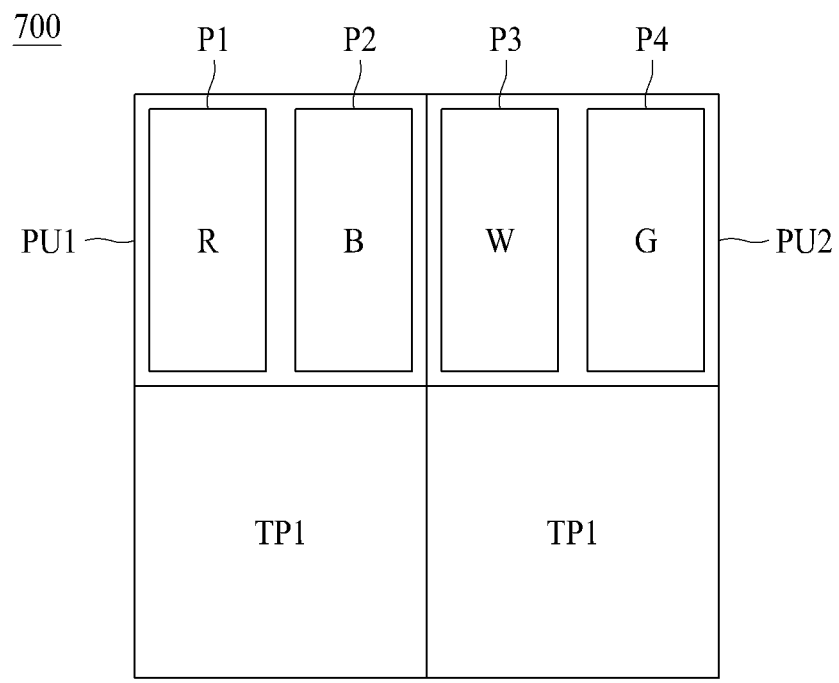
FIG. 15 is a plan view illustrating a pixel array of a display apparatus according to further still another aspect of the present disclosure.

FIG. 15 is a plan view illustrating a pixel array of a display apparatus 700 according to further still another aspect of the present disclosure.

Referring to FIG. 15, the display apparatus 700 according to further still another aspect of the present disclosure includes light transmitting portions TP1 and TP2, which are adjacent to the first display unit PU1 and the second display unit PU2. The light transmitting portions TP1 and TP2 transmit light. According to another aspect of the present disclosure, the light transmitting portion adjacent to the first display unit PU1 is referred to as the first light transmitting portion TP1, and the light transmitting portion adjacent to the second display unit PU2 is referred to as the second light transmitting portion TP2.

The display apparatus 700 shown in FIG. 15 is, for example, a transparent display apparatus. The transparent display apparatus includes light transmitting portions TP1 and TP2 and pixel P1, P2, P3 and P4, and the light transmitting portions TP1 and TP2 and the pixel P1, P2, P3 and P4 may alternately be disposed on one display panel.

In detail, according to another aspect of the present disclosure, the first display unit PU1 and the first light transmitting portion TP1 may alternately be disposed. The first display unit PU1 includes a first pixel P1 and a second pixel P2. In addition, according to another aspect of the present disclosure, the second display unit PU2 and the second light transmitting portion TP2 may alternately be disposed. The second display unit PU2 includes a third pixel P3 and a fourth pixel P4.

According to another aspect of the present disclosure, an area of each of the light transmitting portions TP1 and TP2 may be the same as or similar to an area of the first display unit PU1 or the second display unit PU2. As a result, light may be transmitted through the display apparatus 700, and an opposite side of the display apparatus may be viewed by a viewer.

In addition, even though a color is displayed on the pixel P1, P2, P3 and P4 of the display apparatus 700 according to further still another aspect of the present disclosure, light may be transmitted through the light transmitting portions TP1 and TP2. Therefore, a transparent display apparatus may be embodied.

Figure 16:
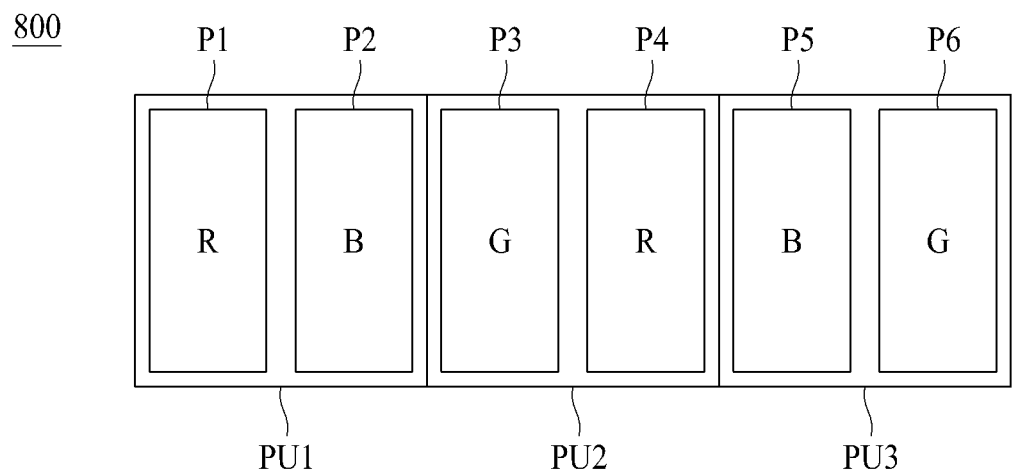
FIG. 16 is a plan view illustrating a pixel array of a display apparatus according to further still another aspect of the present disclosure.

FIG. 16 is a plan view illustrating a pixel array of a display apparatus 800 according to further still another aspect of the present disclosure. The display apparatus 800 shown in FIG. 16 includes a third display unit PU3 in addition to the first display unit PU1 and the second display unit PU2.

In detail, the display apparatus 800 shown in FIG. 16 further includes a fifth pixel P5 and a sixth pixel P6 in addition to the first pixel P1, the second pixel P2, the third pixel P3 and the fourth pixel P4. The fifth pixel P5 includes a fifth pixel driving circuit, and a fifth display element connected with the fifth pixel driving circuit, and the sixth pixel P6 includes a sixth pixel driving circuit, and a sixth display element connected with the sixth pixel driving circuit. The fifth pixel driving circuit and the sixth pixel driving circuit are overlapped with each other, and an electric field blocking layer 210 is disposed between the fifth pixel driving circuit and the sixth pixel driving circuit.

According to another aspect of the present disclosure, the fifth pixel P5 and the sixth pixel P6 constitute a third display unit PU3. The third display unit PU3 may be adjacent to at least one of the first display unit PU1 or the second display unit PU2.

The fifth pixel P5 and the sixth pixel P6 may be disposed in the same manner as the first pixel P1 and the second pixel P2 shown in FIG. 3.

In addition, each of the first pixel P1, the second pixel P2, the third pixel P3 and the fourth pixel P4 may have the same structure as any one of the pixels P shown in FIGS. 2, 9 and 10. Each of the fifth pixel driving circuit and the sixth pixel driving circuit may have the same circuit configuration as any one of the pixel driving circuits PDC shown in FIGS. 2, 9 and 10.

Each of the fifth display element and the sixth display element may be an organic light emitting diode (OLED).

In the display apparatus 800 shown in FIG. 16, the first pixel P1 may display the first color, the second pixel P2 may display the second color, the third pixel P3 may display the third color, the fourth pixel P4 may display the first color, the fifth pixel P5 may display the second color, and the sixth pixel P6 may display the third color. In this case, the first color, the second color and the third color may be different from one another. According to another aspect of the present disclosure, the first pixel P1 and the fourth pixel P4 may display the same color, the second pixel P2 and the fifth pixel P5 may display the same color, and the third pixel P3 and the sixth pixel P6 may display the same color.

According to another aspect of the present disclosure, the first color may be a red color R, the second color may be a green color G, and the third color may be a blue color B.

According to another aspect of the present disclosure, a red pixel, a green pixel and a blue pixel may form one pixel group, and two pixel groups may be displayed by the first display unit PU1, the second display unit PU2 and the third display unit PU3.

According to the present disclosure, the following advantageous effects may be obtained.

According to one aspect of the present disclosure, since a plurality of pixel driving circuits are disposed to overlap each other, a large number of thin film transistors may be disposed in a limited area. As a result, according to one aspect of the present disclosure, the thin film transistors may be integrated with a high density in the display apparatus, and the display apparatus of high resolution may be manufactured. In addition, according to one aspect of the present disclosure, a transparent display apparatus in which a pixel driving circuit is disposed only in a limited area may easily be manufactured.

In addition, in one aspect of the present disclosure, even though the plurality of thin film transistors are disposed to overlap each other, electrical interference between the thin film transistors is not generated. As a result, the display apparatus of high resolution, which has excellent display performance, may be manufactured, and a transparent display apparatus in which a pixel driving circuit is disposed only in a limited area may easily be manufactured.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:
a first pixel driving circuit;
an electric field blocking layer disposed on the first pixel driving circuit;
a second pixel driving circuit disposed on the electric field blocking layer; and
a first display element and a second display element disposed on the second pixel driving circuit,
wherein each of the first pixel driving circuit and the second pixel driving circuit includes at least one thin film transistor,
the first pixel driving circuit overlaps with the second pixel driving circuit,
the first display element is connected with the first pixel driving circuit, and
the second display element is connected with the second pixel driving circuit.

2. The display apparatus of claim 1, wherein the first display element overlaps with the first pixel driving circuit and the second pixel driving circuit, and
wherein the second display element overlaps with the first pixel driving circuit and the second pixel driving circuit.

3. The display apparatus of claim 1, wherein the electric field blocking layer has a thickness of 1 μm or greater between the first pixel driving circuit and the second pixel driving circuit, and
wherein the thickness of the electric field blocking layer is defined as a distance between an upper surface of the first pixel driving circuit and a lower surface of the second pixel driving circuit.

4. The display apparatus of claim 1, wherein the electric field blocking layer has a dielectric constant of 3.9 or less.

5. The display apparatus of claim 1, wherein the electric field blocking layer includes a siloxane compound.

6. The display apparatus of claim 1, wherein each of the first pixel driving circuit and the second pixel driving circuit includes two or more thin film transistors.

7. The display apparatus of claim 1, wherein each of the first pixel driving circuit and the second pixel driving circuit includes four or more thin film transistors.

8. The display apparatus of claim 1, wherein one thin film transistor of the first pixel driving circuit and one thin film transistor of the second pixel driving circuit overlap with each other, and
each of the thin film transistor of the first pixel driving circuit and the thin film transistor of the second pixel driving circuit, which overlap with each other, includes:
an active layer; and
a gate electrode spaced apart from the active layer and at least partially overlapping with the active layer, and
a spaced distance between the gate electrode of the thin film transistor of the first pixel driving circuit and the active layer of the thin film transistor of the second pixel driving circuit is 1 μm or greater.

9. The display apparatus of claim 1, wherein the first display element includes a first electrode, a first organic light emitting layer and a second electrode, and
wherein the second display element includes a first electrode, a second organic light emitting layer and a second electrode.

10. The display apparatus of claim 9, wherein each of the first electrode of the first display element and the first electrode of the second display element has a reflective layer, and the display apparatus is a top emission type in which each of the first display element and the second display element emits light through the second electrode.

11. The display apparatus of claim 1, further comprising:
a bank layer defining a light emission area of the first display element and a light emission area of the second display element;
a first connection portion for connecting the first display element with the first pixel driving circuit; and
a second connection portion for connecting the second display element with the second pixel driving circuit,
wherein at least one of the first connection portion and the second connection portion overlaps the bank layer.

12. The display apparatus of claim 11, wherein at least a portion of the first connection portion overlaps with the bank layer.

13. The display apparatus of claim 11, wherein the first connection portion includes a first portion passing through the electric field blocking layer, and
wherein the first portion overlaps with the bank layer.

14. The display apparatus of claim 1, wherein each of the thin film transistor of the first pixel driving circuit and the thin film transistor of the second pixel driving circuit includes an active layer and a gate electrode spaced apart from the active layer, and
wherein a thickness 't' of the electric field blocking layer satisfies the following Equation 1:

$$t \approx (V_{GH}/V_{TH}) \times (\kappa/3.9) \times (t_{GI}),$$ [Equation 1]

where, in Equation 1, t is the thickness of the electric field blocking layer, κ is a dielectric constant of the electric field blocking layer, $V_{GH}$ is a turn-on voltage applied to the thin film transistor of the first pixel driving circuit, $V_{TH}$ is a threshold voltage of the thin film transistor of the second pixel driving circuit, and $t_{GI}$ is a distance between the gate electrode and the active layer of the thin film transistor of the second pixel driving circuit.

15. The display apparatus of claim 1, wherein the second pixel driving circuit includes a buffer layer disposed on the electric field blocking layer, and the buffer layer includes an insulating material.

16. A display apparatus comprising:
a first pixel including a first pixel driving circuit and a first display element connected with the first pixel driving circuit;
a second pixel including a second pixel driving circuit and a second display element connected with the second pixel driving circuit;
a third pixel including a third pixel driving circuit and a third display element connected with the third pixel driving circuit;
a fourth pixel including a fourth pixel driving circuit and a fourth display element connected with the fourth pixel driving circuit; and
an electric field blocking layer disposed between the first pixel driving circuit and the second pixel driving circuit and between the third pixel driving circuit and the fourth pixel driving circuit,
wherein the first pixel driving circuit and the second pixel driving circuit overlap with each other,
the third pixel driving circuit and the fourth pixel driving circuit overlap with each other,
the first pixel and the second pixel constitute a first display unit,
the third pixel and the fourth pixel constitute a second display unit, and
the first display unit and the second display unit are adjacent to each other.

17. The display apparatus of claim 16, wherein the electric field blocking layer has a thickness of 1 μm or greater, and
wherein the thickness of the electric field blocking layer is defined as a distance between an upper surface of the first pixel driving circuit and a lower surface of the second pixel driving circuit.

18. The display apparatus of claim 16, wherein the electric field blocking layer has a dielectric constant of 3.9 or less.

19. The display apparatus of claim 16, wherein the electric field blocking layer includes a siloxane compound.

20. The display apparatus of claim 16, wherein each of the first pixel driving circuit and the second pixel driving circuit includes at least one thin film transistor,
each of the thin film transistor of the first pixel driving circuit and the thin film transistor of the second pixel driving circuit includes an active layer and a gate electrode spaced apart from the active layer, and
wherein a thickness 't' of the electric field blocking layer satisfies the following Equation 1:

$$t \geq (V_{GH}/V_{TH}) \times (\kappa/3.9) \times (t_{GI}),\quad \text{[Equation 1]}$$

where, in Equation 1, t is the thickness of the electric field blocking layer, κ is a dielectric constant of the electric field blocking layer, $V_{GH}$ is a turn-on voltage applied to the thin film transistor of the first pixel driving circuit, $V_{TH}$ is a threshold voltage of the thin film transistor of the second pixel driving circuit, and $t_{GI}$ is a distance between the gate electrode and the active layer of the thin film transistor of the second pixel driving circuit.

21. The display apparatus of claim 16, wherein each of the first pixel driving circuit, the second pixel driving circuit, the third pixel driving circuit and the fourth pixel driving circuit includes two or more thin film transistors.

22. The display apparatus of claim 16, wherein each of the first pixel driving circuit, the second pixel driving circuit, the third pixel driving circuit and the fourth pixel driving circuit includes four or more thin film transistors.

23. The display apparatus of claim 16, wherein the display apparatus is a top emission type.

24. The display apparatus of claim 16, wherein the first pixel displays a first color, the second pixel displays a second color, the third pixel displays a third color, the fourth pixel displays a fourth color, the first color, the second color, the third color and the fourth color are the colors different from one another, and one of the first color, the second color, the third color and the fourth color is white.

25. The display apparatus of claim 24, wherein another one of the first color, the second color, the third color and the fourth color is red, still another one is green, and further still another one is blue.

26. The display apparatus of claim 16, wherein the first pixel displays a first color, the second pixel displays a second color, the third pixel displays the first color, the fourth pixel displays a third color, and the first, second and third colors are different from one another.

27. The display apparatus of claim 26, wherein the first color is green, one of the second color and the third color is red and another color is blue.

28. The display apparatus of claim 16, further comprising light transmitting portions adjacent to the first display unit and the second display unit,
wherein the light transmitting portions transmit light.

29. The display apparatus of claim 16, further comprising:
a fifth pixel including a fifth pixel driving circuit and a fifth display element connected with the fifth pixel driving circuit; and
a sixth pixel including a sixth pixel driving circuit and a sixth display element connected with the sixth pixel driving circuit,
wherein the fifth pixel driving circuit and the sixth pixel driving circuit overlap each other,
the electric field blocking layer is disposed between the fifth pixel driving circuit and the sixth pixel driving circuit,
the fifth pixel and the sixth pixel constitute a third display unit, and
the third display unit is adjacent to at least one of the first display unit and the second display unit.

30. The display apparatus of claim 29, wherein the first pixel displays a first color, the second pixel displays a second color, the third pixel displays a third color, the fourth pixel displays the first color, the fifth pixel displays the second color, the sixth pixel displays the third color, and
wherein the first, second and third colors are the colors different from one another.

31. The display apparatus of claim 30, wherein the first color is red, the second color is green, and the third color is blue.

* * * * *